(12) United States Patent  (10) Patent No.: US 7,723,228 B2
Rajagopalan et al. (45) Date of Patent: May 25, 2010

(54) REDUCTION OF HILLOCKS PRIOR TO DIELECTRIC BARRIER DEPOSITION IN CU DAMASCENE

(75) Inventors: Nagarajan Rajagopalan, Santa Clara, CA (US); Meiyee Shek, Mountain View, CA (US); Kegang Huang, Fremont, CA (US); Bok Hoen Kim, San Jose, CA (US); Hichem M'saad, Santa Clara, CA (US); Thomas Nowak, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2107 days.

(21) Appl. No.: 10/442,359

(22) Filed: May 20, 2003

(65) Prior Publication Data

US 2004/0235292 A1 Nov. 25, 2004

(51) Int. Cl.
 *H01L 21/4763* (2006.01)
(52) U.S. Cl. .............................. 438/637; 257/E21.293
(58) Field of Classification Search ....................... None
 See application file for complete search history.

(56) References Cited

U.S. PATENT DOCUMENTS

| | | |
|---|---|---|
| 4,525,733 A | 6/1985 | Losee |
| 4,704,367 A | 11/1987 | Alvis et al. |
| 5,518,805 A | 5/1996 | Ho et al. |
| 5,589,233 A | 12/1996 | Law et al. |
| 5,736,423 A | 4/1998 | Ngo |
| 5,755,859 A | 5/1998 | Brusic et al. |
| 5,811,356 A | 9/1998 | Murugesh et al. |
| 5,824,375 A | 10/1998 | Gupta |
| 5,968,587 A | 10/1999 | Frankel |
| 5,970,383 A | 10/1999 | Lee |
| 6,020,035 A | 2/2000 | Gupta et al. |
| 6,083,822 A | 7/2000 | Lee |
| 6,095,085 A | 8/2000 | Agarwal |
| 6,121,161 A | 9/2000 | Rossman et al. |
| 6,268,274 B1 | 7/2001 | Wang et al. |
| 6,274,058 B1 | 8/2001 | Rajagopalan et al. |
| 6,348,403 B1 | 2/2002 | Raina et al. |
| 6,348,410 B1 | 2/2002 | Ngo et al. |
| 6,355,571 B1 | 3/2002 | Huang et al. |
| 6,365,518 B1 | 4/2002 | Lee et al. |
| 6,368,948 B1 | 4/2002 | Ngo et al. |
| 6,391,777 B1 | 5/2002 | Chen et al. |
| 6,399,489 B1 | 6/2002 | M'Saad et al. |
| 6,426,015 B1 | 7/2002 | Xia et al. |
| 6,426,289 B1 | 7/2002 | Farrar |

(Continued)

FOREIGN PATENT DOCUMENTS

EP 0843347 A2 5/1998

*Primary Examiner*—Thao P. Le
(74) *Attorney, Agent, or Firm*—Townsend and Townsend and Crew

(57) ABSTRACT

Unwanted hillocks arising in copper layers due to formation of overlying barrier layers may be significantly reduced by optimizing various process parameters, alone or in combination. A first set of process parameters may be controlled to pre-condition the processing chamber in which the barrier layer is deposited. A second set of process parameters may be controlled to minimize energy to which a copper layer is exposed during removal of CuO prior to barrier deposition. A third set of process parameters may be controlled to minimize the thermal budget after removal of the copper oxide.

12 Claims, 18 Drawing Sheets

U.S. PATENT DOCUMENTS

| | | |
|---|---|---|
| 6,479,098 B1 | 11/2002 | Yoo et al. |
| 6,589,868 B2 | 7/2003 | Rossman |
| 6,624,064 B1 | 9/2003 | Sahin et al. |
| 6,734,101 B1 | 5/2004 | Bao et al. |
| 6,846,742 B2 | 1/2005 | Rossman |
| 6,974,781 B2 | 12/2005 | Timmermans et al. |
| 7,241,690 B2 | 7/2007 | Pavone et al. |
| 7,253,124 B2 * | 8/2007 | Lu et al. ............... 438/795 |
| 7,273,808 B1 * | 9/2007 | Lin ............... 438/622 |
| 7,288,284 B2 | 10/2007 | Li et al. |
| 7,371,427 B2 * | 5/2008 | Rajagopalan et al. ....... 427/237 |
| 2002/0068458 A1 * | 6/2002 | Chiang et al. ............... 438/694 |
| 2002/0146512 A1 | 10/2002 | Rossman |
| 2002/0170487 A1 | 11/2002 | Zehavi et al. |
| 2003/0032207 A1 * | 2/2003 | Rengarajan et al. ........... 438/14 |
| 2003/0072695 A1 * | 4/2003 | Ruelke et al. ............... 422/186 |
| 2003/0143410 A1 | 7/2003 | Won et al. |
| 2004/0038529 A1 * | 2/2004 | Soininen et al. ............. 438/685 |
| 2004/0061229 A1 * | 4/2004 | Moslehi ............... 257/758 |
| 2005/0214454 A1 | 9/2005 | Yang et al. |
| 2008/0216958 A1 | 9/2008 | Goto et al. |

* cited by examiner

REDUCTION OF HILLOCKS PRIOR TO DIELECTRIC BARRIER DEPOSITION IN CU DAMASCENE

BACKGROUND OF THE INVENTION

Due to its relatively low resistance and cost, copper is finding increasing use as a conductive layer in the interconnect metallization structures of integrated circuits and other semiconductor devices. FIGS. 1A-1E show simplified cross-sectional views of conventional steps for fabricating a damascene interconnect structure utilizing copper metallization.

In FIG. 1A, an interlayer dielectric (ILD) 100 is formed over a first conducting layer 102 and then patterned to create opening 104. While opening 104 is generically shown in FIG. 1A as a via hole, in dual damascene approaches the opening can take the more complex form of a trench overlying a narrower via hole.

In FIG. 1B, a first barrier layer 106 is formed within opening 104 and over patterned ILD 100. Barrier layer 106 may be formed from a variety of materials, including but not limited to SiN, TiN, Ta, TaN, Ta/TaN, as well as the barrier low k (BLOK®) material manufactured by Applied Materials, Inc. of Santa Clara, Calif. The primary function of the barrier layer is to block diffusion of copper of the metallization structure. ILD 100 and barrier layer 106 may be formed by such techniques such as chemical vapor deposition, as performed by the PRODUCER® tool manufactured by Applied Materials, Inc. of Santa Clara, Calif.

In FIG. 1C, copper metal interconnect 108 is formed over first barrier layer 106, within opening 104 and over the top of ILD layer 100. The copper metal 108 may be formed by such techniques as electroplating, for example as is performed by the ELECTRA CU™ tool manufactured by Applied Materials, Inc. of Santa Clara, Calif.

In FIG. 1D, the wafer is removed from the electroplating device and transferred to a chemical mechanical polishing tool for removal of copper metal 108 and barrier layer 106 outside of the now-filled opening in ILD 100, resulting in the formation of conducting copper via structure 110. In FIG. 1E, the wafer is transferred from the chemical mechanical polishing module to a chemical vapor deposition (CVD) module for formation of second barrier layer 112 over copper via 110. The function of second barrier layer 112 to block any upward diffusion of copper metal from the via into successive dielectric layers of the interconnect structure.

The process sequence shown and described above in connection with FIGS. 1A-1E can be repeated to form additional metallization layers overlying and in contact with copper via 110.

The process flow just shown and described is somewhat simplified. For example, FIGS. 1CA-CC show detailed and enlarged views of the fabrication steps leading up to creation of the copper via shown in FIG. 1D. Specifically, removal of excess copper metal during the CMP step shown in FIG. 1C may be performed under oxidizing conditions. Thus, as shown in FIG. 1CB, at the conclusion of the CMP step and prior to formation of the second barrier layer, a thin copper oxide layer 114 typically overlies copper via plug 110. Formation of such a copper oxide layer is not necessarily the result of CMP performed under oxidizing conditions, and copper oxide may also result from exposing the processed wafer to air, as may occur during transfer of the wafer between different processing tools.

Because this copper oxide layer 114 is a dielectric material, it can degrade the conductive properties of the interconnected metallization Therefore, as shown in FIG. 1CC, the metallization layer may be exposed to a reactive ionized species from a plasma to remove the copper oxide prior to formation of the top barrier layer and additional portions of the interconnect structure. The oxide removal plasma may be generated in gases such as $NH_3$ mixed with a carrier gas comprising $N_2$. The oxide removal plasma may be generated remote from the chamber or generated within the chamber. This plasma exposure may take place in the same chamber in which the upper barrier layer is subsequently deposited. Methods and apparatuses for removing copper oxide are described in detail in U.S. Pat. No. 6,365,518, coassigned with the present invention and hereby incorporated by reference for all purposes.

Another detail not shown in the generalized FIGS. 1A-E is the potential undesirable formation of hillocks in the copper metallization layer. Hillock formation is shown and described in connection with FIGS. 1DA-1DC.

FIG. 1DA shows a cross-sectional view of the interconnect structure after removal of the CuO layer by plasma exposure following removal of the unwanted CuO layer. As shown in FIG. 1DB, hillocks 108a may undesirably grow out of the plane of the copper layer 108 prior to or during formation of the upper barrier layer. The growth and presence of hillocks 108a can create issues regarding performance of the interconnect structure, such as elevated electrical resistance and/or shorting.

Therefore, there is a need in the art for methods and apparatuses which reduce the incidence of hillock formation during the fabrication of copper metallization structures.

BRIEF SUMMARY OF THE INVENTION

Unwanted hillocks arising in copper due to formation of overlying barrier layers may be significantly reduced by optimizing various process parameters, alone or in combination. A first set of process parameters may be controlled to precondition the processing chamber in which the barrier layer is deposited. A second set of process parameters may be controlled to minimize energy to which a copper layer is exposed during removal of CuO prior to barrier deposition. A third set of process parameters may be controlled to minimize the thermal budget after removal of the copper oxide.

An embodiment of a method in accordance with the present invention for fabricating a copper metallization structure comprises disposing a wafer bearing a copper metallization layer in a processing chamber; and exposing the wafer to a plasma in the processing chamber to remove a residual copper oxide layer overlying the copper metallization layer, the plasma formed in an ambient comprising a gas having a molecular weight of 17 or less.

An embodiment of a method in accordance with the present invention for reducing formation of hillocks in a copper layer during fabrication of a semiconductor device, comprises, providing a wafer bearing a copper layer with a residual surface oxide layer to lift pins extended above a surface of a wafer support positioned within a processing chamber, and stabilizing a flow of a gas ambient into the processing chamber. The lift pins are retracted to lower the wafer into contact with the wafer support, the wafer is exposed to a plasma generated from the ambient to remove the residual copper oxide layer, and a barrier layer is deposited on top of the wafer.

An embodiment of a substrate processing apparatus in accordance with the present invention comprises a processing chamber, a gas distribution system configured to receive and deliver gases to a gas distribution face plate located proximate to the substrate heater in the processing chamber, and an RF power system configured to apply RF radiation to the processing chamber. A substrate heater includes retractable lift pins configured to support a substrate within the processing chamber and moveable relative to the gas distribution face plate. A controller is configured to control the gas delivery system, the RF power system, and the substrate support. A memory is coupled to the controller and comprises a computer-readable medium having a computer-readable program embodied therein for directing operation of the substrate processing apparatus. The computer-readable program includes a first set of computer instructions for controlling the substrate heater to extend the lift pins to receive a wafer bearing a copper layer, a second set of computer instructions for controlling the gas delivery system to cause the flow of gas to be delivered into the chamber, and a third set of computer instructions for controlling the substrate heater to retract the lift pins and thereby bring the wafer into contact with the heater upon stabilization of the gas flow into the chamber.

A further understanding of embodiments in accordance with the present invention can be made by way of reference to the ensuing detailed description taken in conjunction with the accompanying drawings.

BRIEF DESCRIPTION OF THE DRAWINGS

FIGS. 1CA-1CC and 1DA-1DC show detailed, enlarged cross-sectional views of certain of the steps of the conventional process flow shown in FIGS. 1A-1E.

DETAILED DESCRIPTION OF THE INVENTION

Unwanted formation of hillocks in copper layers during the fabrication of semiconductor devices may be reduced in accordance with embodiments of the present invention by carefully controlling a number of process parameters, alone or in combination. A first set of process parameters may be controlled to pre-condition the barrier layer deposition chamber prior to its receiving a wafer bearing a copper layer. A second set of process parameters may be controlled to minimize the energy to which the copper layer is exposed during removal of copper oxide prior to deposition of the barrier layer. A third set of process parameters may be controlled to minimize the thermal budget that the copper layer is exposed to after removal of the copper oxide. Control over each of these sets of parameters is discussed in detail below.

I. Reduction of Hillock Formation in Copper Layers

Research has indicated that the formation of hillocks in copper layers may be attributable to diffusion of copper along grain boundaries of the metallization layer in response to stress. Stress resulting in hillock formation may be imparted to the copper grains through application of thermal or other types of energy. Grains of the Cu layer may in turn release this stress by diffusing along grain boundaries and growing out of the plane of the copper layer to form the unwanted hillock features.

Figure 1A:
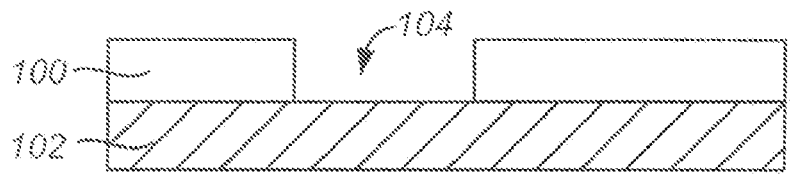
FIGS. 1A-E show simplified cross-sectional views of steps of a conventional process flow for forming a copper Damascene interconnect structure.
Figure 1B:
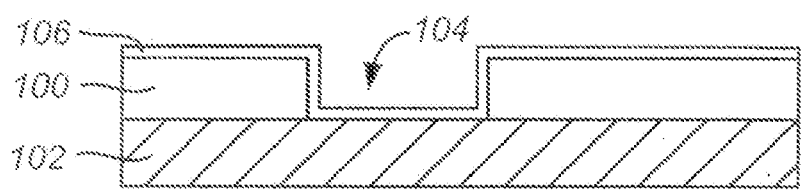
Figure 1C:
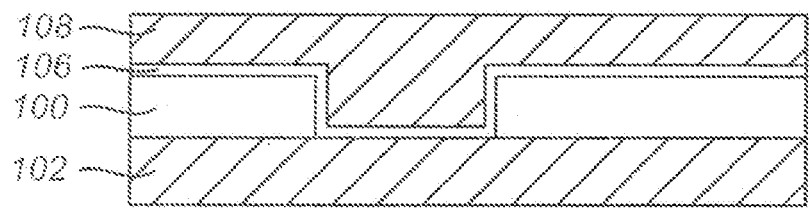
Figure 1D:
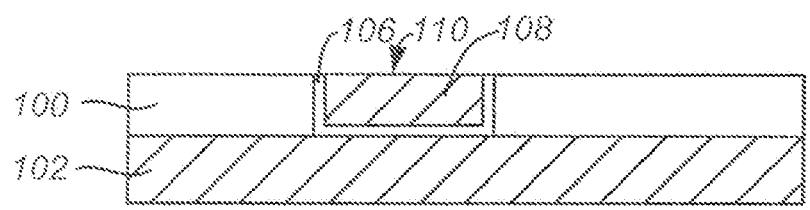
Figure 1E:
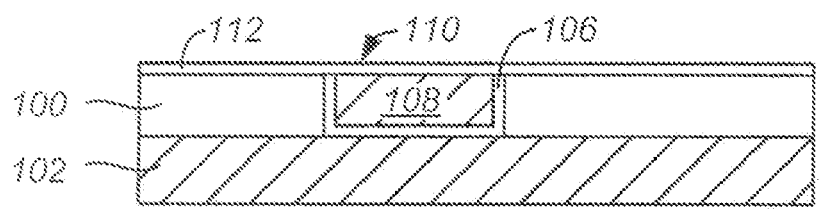
Figure 1C:
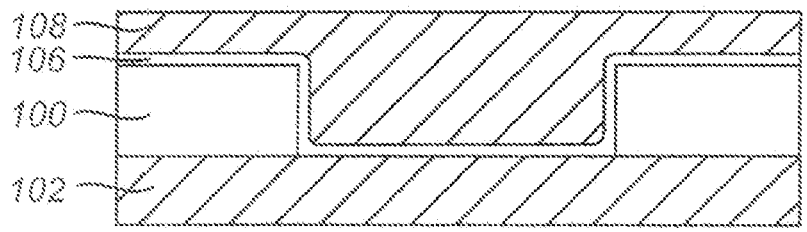
Figure 1C:
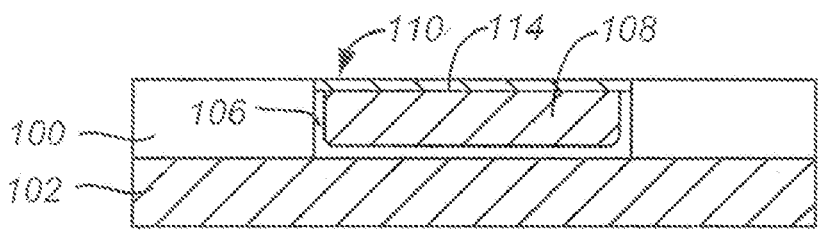
Figure 1C:
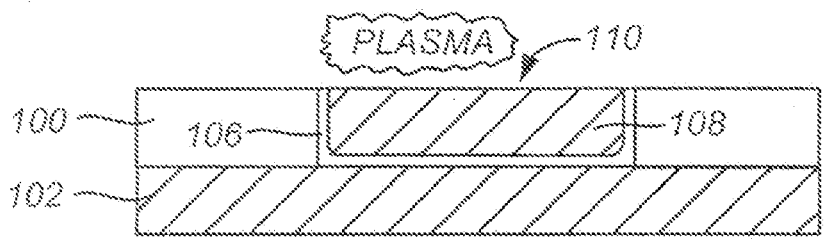
Figure 1D:
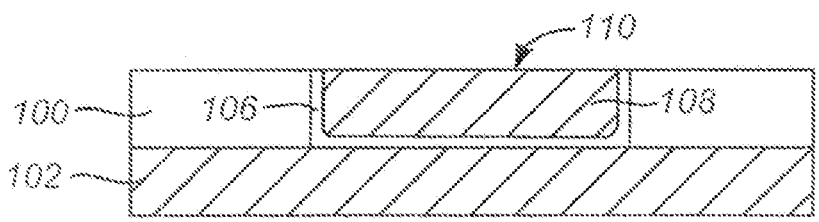
Figure 1D:
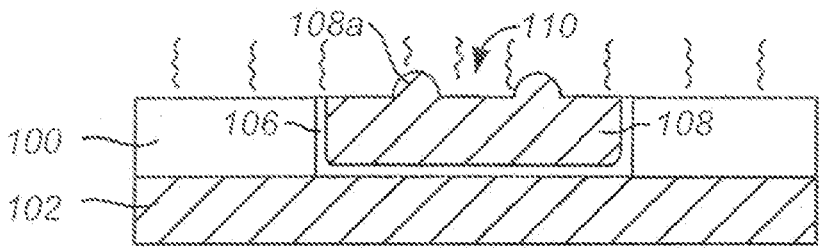
Figure 1D:
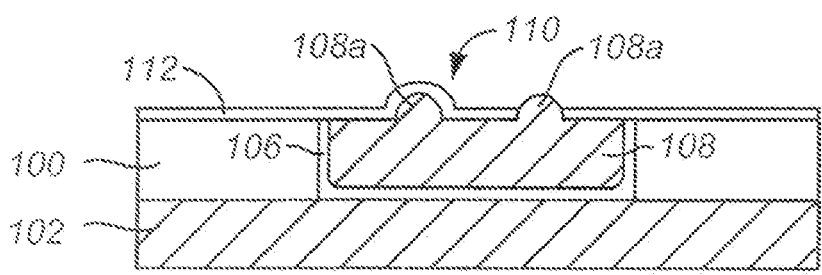
Figure 2B:
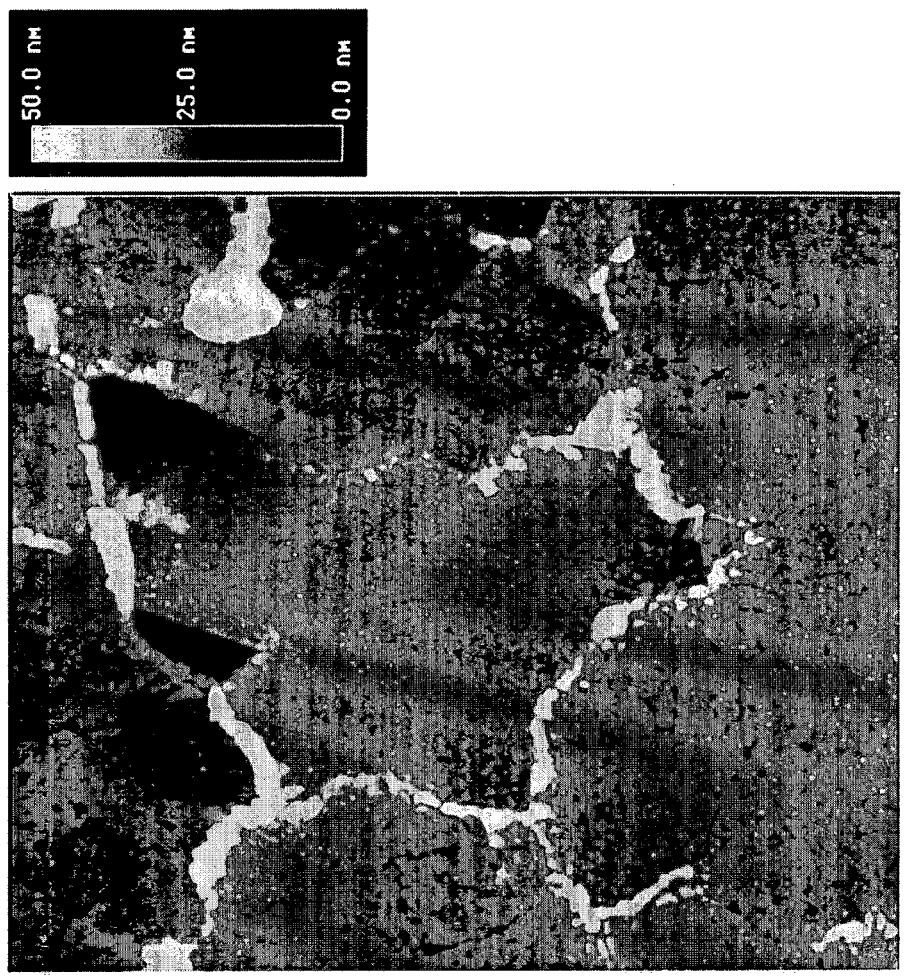
FIGS. 2A and 2B are atomic force micrographs of a blanket Cu layer showing hillock formation.
Figure 2A:
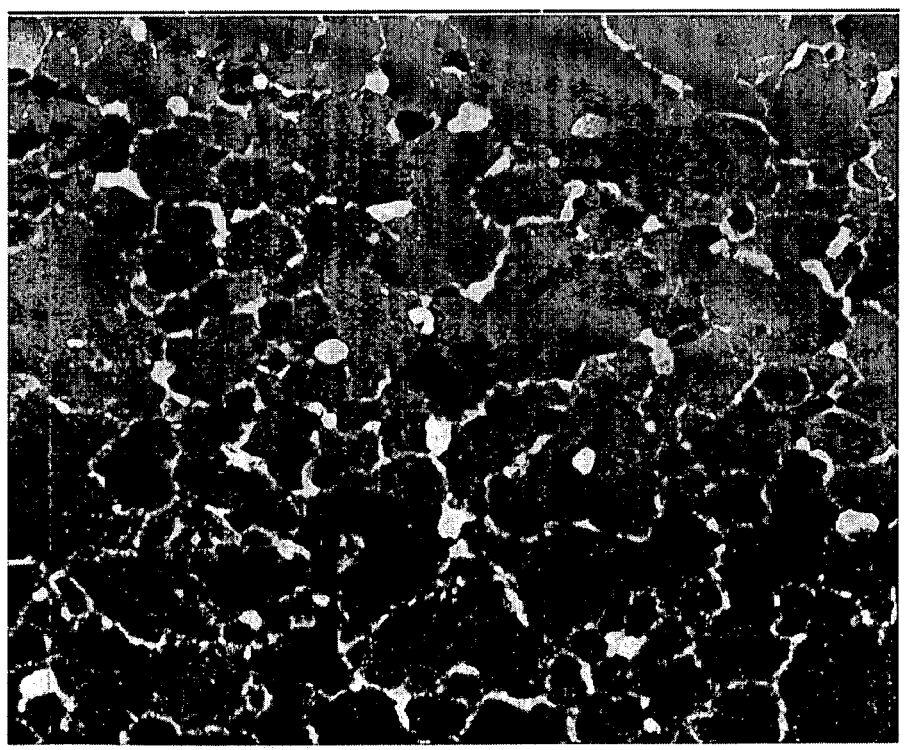

The formation of hillocks in copper is illustrated in FIG. 2A, which shows an atomic force micrograph at a scan size of 25μ×25μ of the surface of a wafer bearing a blanket copper layer which has been annealed at 330° C. for 60 seconds. FIG. 2B shows an atomic force micrograph for the same wafer at a scan size of 5μ×5μ. The hillocks shown in FIGS. 2A-B are formed as the copper layer relaxes in response to the application of stress.

Figure 3:
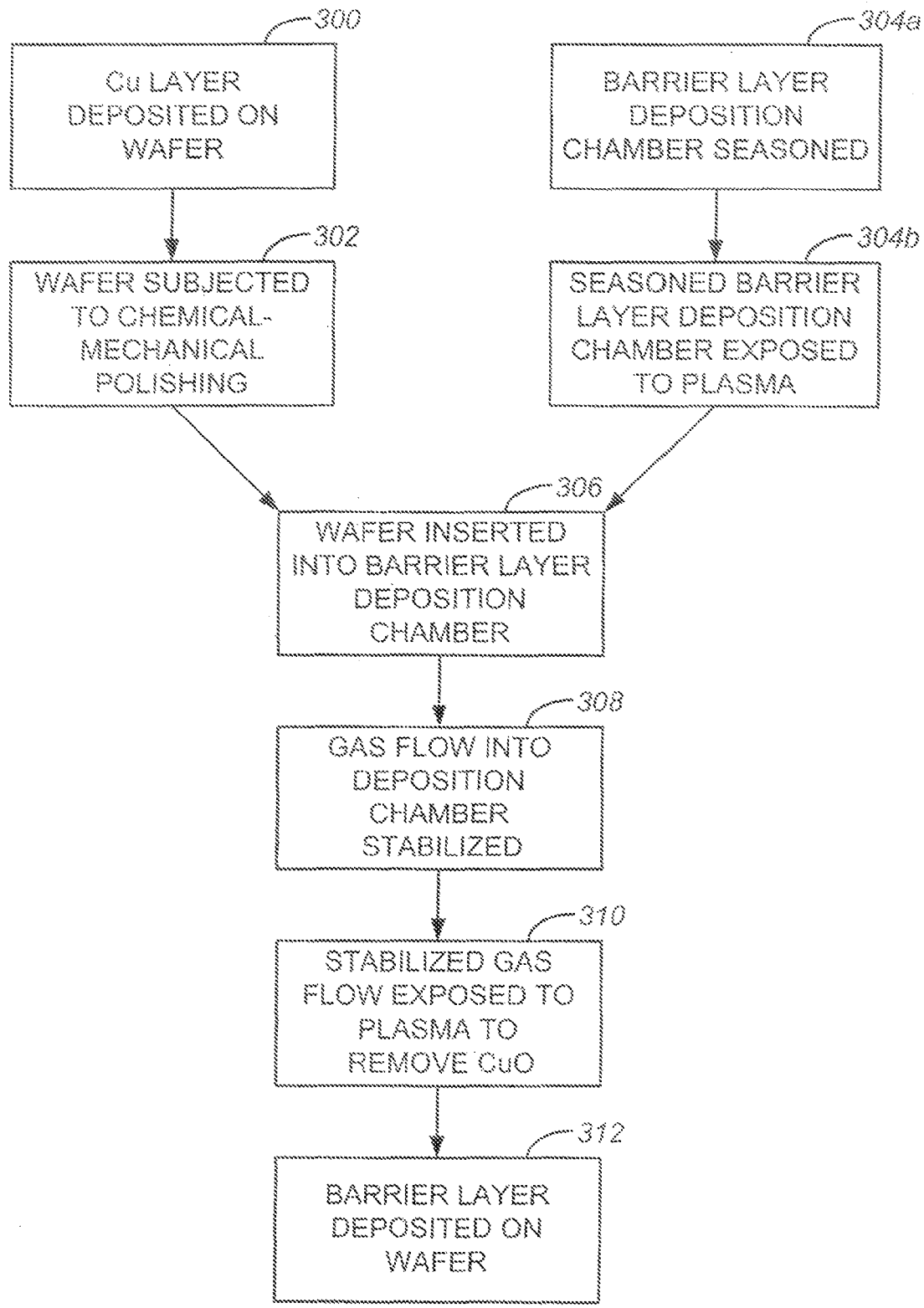
FIG. 3 is a simplified flow chart illustrating post-Cu formation steps that may give rise to hillock formation.

One source of such stress-inducing energy may be a semiconductor fabrication process occurring after initial formation of the Cu layer. FIG. 3 shows a flow chart of a series of processing steps that may take place after Cu is deposited on a substrate.

In step 300, a copper layer is deposited on a wafer or substrate. In step 302, the wafer bearing the copper layer is exposed to chemical mechanical polishing conditions, which may result in formation of a layer of oxide over the copper.

In steps 304a-b, a chamber in which deposition of a barrier layer is to take place is conditioned in preparation to receive the copper-bearing substrate. Specifically, in step 304a the chamber is seasoned. In step 304b the chamber may be exposed to a plasma for cleaning purposes. The chamber seasoning and cleaning steps are independent in nature, and substrate processing may occur with either, none, or both steps 304a and 304b having been performed.

In step 306, the substrate is inserted into conditioned deposition chamber. In step 308, flow rates of gases to the deposition chamber are stabilized. In step 310, the stable flow of gases is excited by exposure to a plasma, such that oxide overlying the copper layer is removed. In step 312, the oxide removal plasma is replaced by a plasma containing reactive gases which react to deposit a barrier layer over the copper layer on the substrate.

As discussed in detail below, in accordance with embodiments of the present invention, at one or more points during the process shown in FIG. 3, the processing parameters may be altered to reduce the incidence of hillock formation in the copper layer.

A. Barrier Layer Deposition Chamber Pre-Conditioning

Returning to step 306 of FIG. 3, following the chemical mechanical planarization of the copper layer, the wafer is transferred to a different chamber to form the overlying barrier layer by chemical vapor deposition. By employing certain chamber pre-conditioning steps alone or in combination, prior to the wafer entering the barrier layer deposition chamber, the incidence of hillock formation can be significantly reduced.

One such chamber pre-conditioning step in accordance with an embodiment of the present invention is formation of a silicon oxide seasoning layer within the CVD chamber after cleaning, as shown in step 304a of FIG. 3. Conventionally, where a layer of silicon nitride is to be deposited on a substrate positioned within a chamber, a seasoning layer is first deposited within the empty chamber. This seasoning layer serves to entrap various particles and contamination already present within the chamber, preventing them from falling onto and compromising the substrate. Where a silicon nitride barrier layer is to be deposited within the chamber, the seasoning layer typically comprises silicon nitride alone, or as a part of a stack of silicon nitride and silicon oxide. In accordance with embodiments of the present invention however, the inventors have discovered that seasoning the cleaned deposition chamber with a layer of silicon oxide alone offers the best results.

Another chamber pre-conditioning step in accordance with an embodiment of the present invention is treatment of the seasoned chamber with a plasma prior to insertion of the wafer, as shown in step 304b of FIG. 3. Conventionally, after the chamber in which the barrier layer is to be deposited has been seasoned, the wafer bearing the copper layer is inserted for additional processing. However, in accordance with embodiments of the present invention, it has been discovered that treatment of the seasoned chamber with a plasma prior to insertion of the wafer can reduce hillock formation. Specifically, this post-seasoning plasma treatment step involves the application of a low power density plasma treatment using $N_2$, $N_2O$, $NH_3$, $NF_3$, or Ar or other noble gases, alone or in various combinations. For purposes of this application, the term low power density plasma treatment refers to treatment by a plasma at 3.0 W cm$^2$ or less for 300 mm wafers. TABLE 1 lists typical process parameters which may be employed for a post-seasoning plasma treatment.

TABLE 1

| PROCESS PARAMETER | RANGE |
|---|---|
| Chamber Pressure (Torr) | 0.1-100 |
| Chamber Power (W) | 0.1-2000 |
| Faceplate-to-Wafer Spacing (mils) | 100-2000 |
| $N_2$ Gas Flow Rate (sccm) | 100-20,000 |
| $N_2O$ Gas Flow Rate (sccm) | 100-20,000 |

Figure 4A:
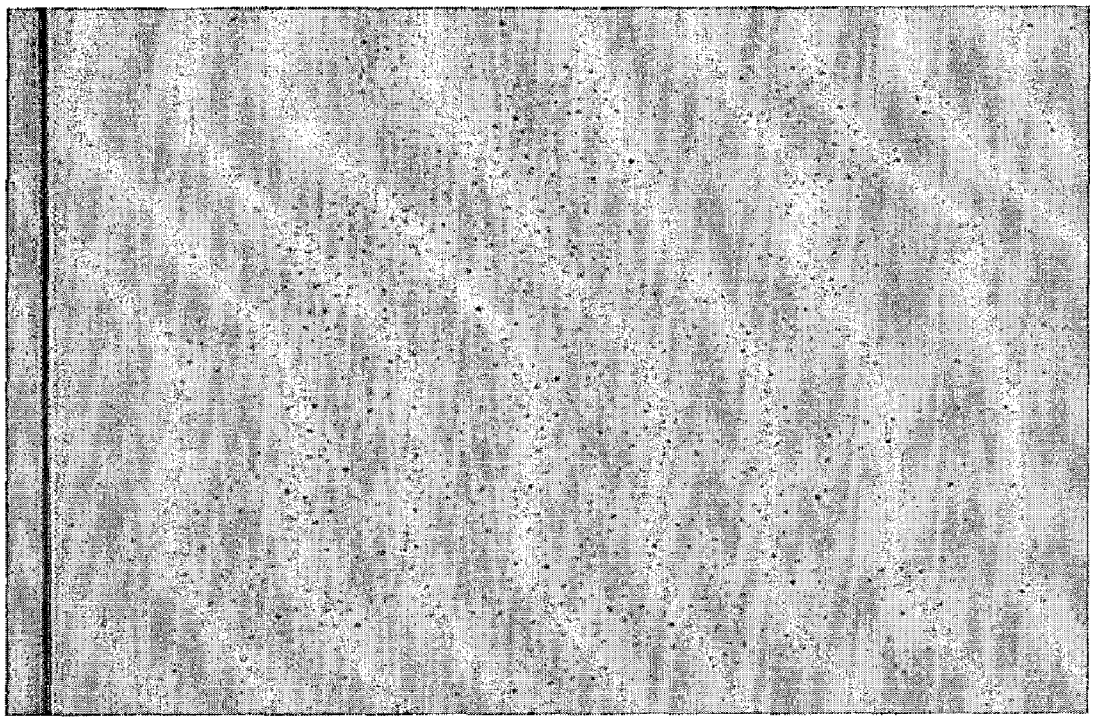
FIGS. 4A-B shows optical micrographs of wafers bearing blanket Cu layers coated with deposited nitride, in seasoned chambers that have or have not been exposed to post-seasoning plasma treatment.
Figure 4B:
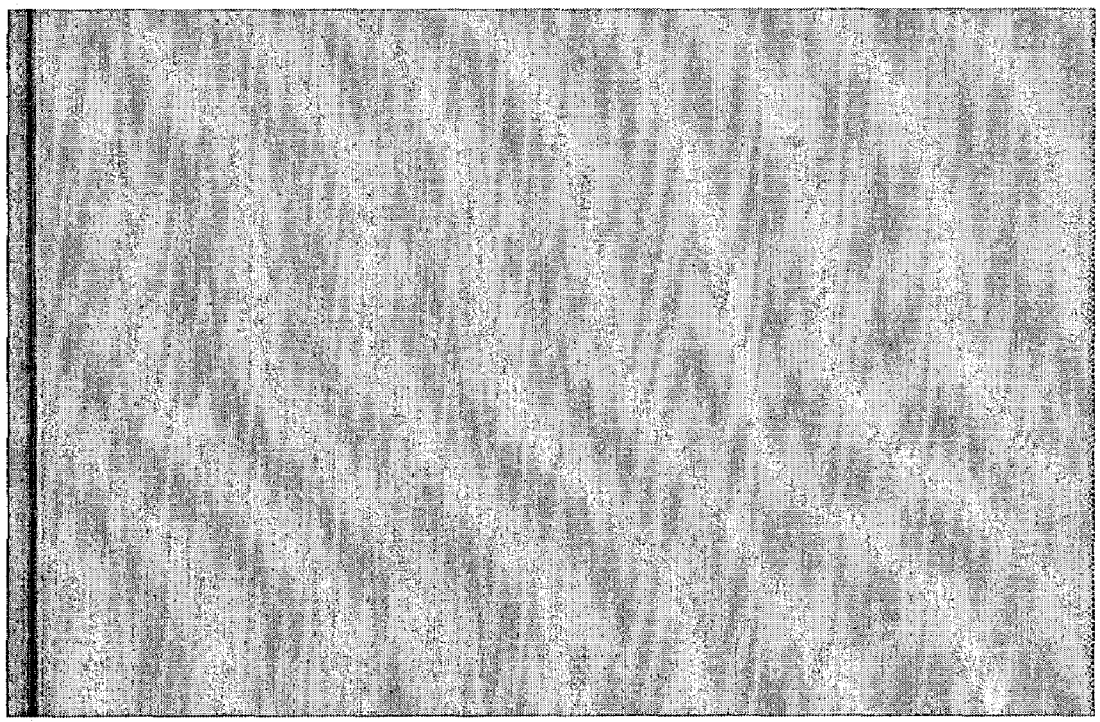

FIGS. 4A-B are electron micrographs showing formation of hillocks in copper layers of wafers processed in two chambers subjected to different pre-conditioning. FIGS. 4A-B, and others of the instant application, show the surface of a silicon nitride layer deposited over a processed copper layer. Because subsequent processing of the Cu layer will alter its hillock profile, this deposited SiN layer preserves and accurately mirrors the hillock profile of the underlying Cu layer immediately after processing.

For example, FIG. 4A shows an optical micrograph of a surface of a wafer bearing a blanket Cu layer coated with a nitride layer, in a seasoned chamber that has not been exposed to a post-seasoning plasma treatment. FIG. 4B shows an optical micrograph of a blanket Cu layer coated with a nitride layer, in a seasoned chamber that has been exposed to a post-seasoning plasma treatment in an ambient of $N_2$ and $N_2O$. Comparison of FIGS. 4A and 4B indicates significantly fewer hillocks present on the surface of the wafer processed in the chamber having the post-seasoning plasma treatment.

The post-seasoning plasma treatment just described represents only one possible embodiment in accordance with the present invention. In alternative embodiments, the post-seasoning plasma may be generated remotely and then flowed into the processing chamber. In still other alternative embodiments, the post-seasoning plasma may be generated in gases other than $N_2$ or $N_2O$, for example in $NF_3$ or $NH_3$, or He or Ar or other noble gases, or combinations thereof.

Moreover, the post-seasoning plasma treatment just described may be utilized alone, or in combination with the silicon oxide seasoning step just described above. Similarly, the silicon oxide seasoning step can be utilized with or without the post-seasoning plasma treatment.

B. CuO Removal

As described above in connection with step 302 of FIG. 3, during or following chemical mechanical planarization of the copper layer, a thin film of CuO may form. This CuO film exhibits relatively high dielectric properties and may undesirably interfere with conductivity of the Cu interconnect metallization structure. Accordingly, during step 310 the wafer bearing the Cu layer and the CuO film is typically exposed to a plasma prior to deposition of the barrier layer. This plasma reacts with and removes the CuO film.

However, exposing the Cu to plasma energy during the CuO film removal can impart stress to the Cu layer. Relaxation of the film in response to this stress can thereby contribute to formation of hillocks. Accordingly, another approach to reducing hillock incidence is to reduce the energy to which the wafer is exposed immediately prior to and during the CuO removal process.

Prior to exposure to the plasma that removes CuO, the flow of gases into the process chamber is stabilized. During this gas flow stabilization period, the Cu-bearing wafer is exposed to elevated temperatures and can undergo stress and relaxation resulting in hillock formation. Accordingly, one technique employed by embodiments in accordance with the present invention is to reduce the extent of physical contact between the wafer and the wafer heater during this gas flow stabilization phase.

As discussed below in connection with FIGS. 12A-B, during loading and unloading of a wafer from the CVD chamber, the wafer is placed upon lift pins which extend upward from the surface of the wafer support/heater. The lift pins then retract into the surface of the support/heater prior to deposition of materials to place the wafer in contact with the surface of the support/heater structure.

The continuous heating and cooling of a substrate support would give rise to undesirable time delays and temperature variation. Accordingly, a voltage is generally constantly applied to the heater, even between wafer processing steps when the chamber is empty. To reduce stress imparted by contact between the substrate and the constantly-heated heater, during gas flow stabilization prior to formation of the plasma removing CuO, the apparatus may be operated in accordance with an embodiment of the present invention to place the wafer in contact with only the lift pins, elevated over the surface of the heater. This positioning of the wafer reduces physical contact between the wafer and the heater, and may potentially reduce by between about 100-150° C. the effective temperature experienced by the wafer. This reduction in the amount of thermal energy imparted to the wafer and the Cu layer formed thereon reduces the chance of stress relaxation and hillock formation. Immediately prior to actual plasma exposure the lift pins retract into the heater surface and place the back side of the wafer into direct contact with the heater.

Figure 5A:
FIGS. 5A-B show optical micrographs of wafers bearing blanket Cu layers coated with deposited nitride, that have or have not been placed into direct contact with the wafer heater during gas flow stabilization.
Figure 5B:
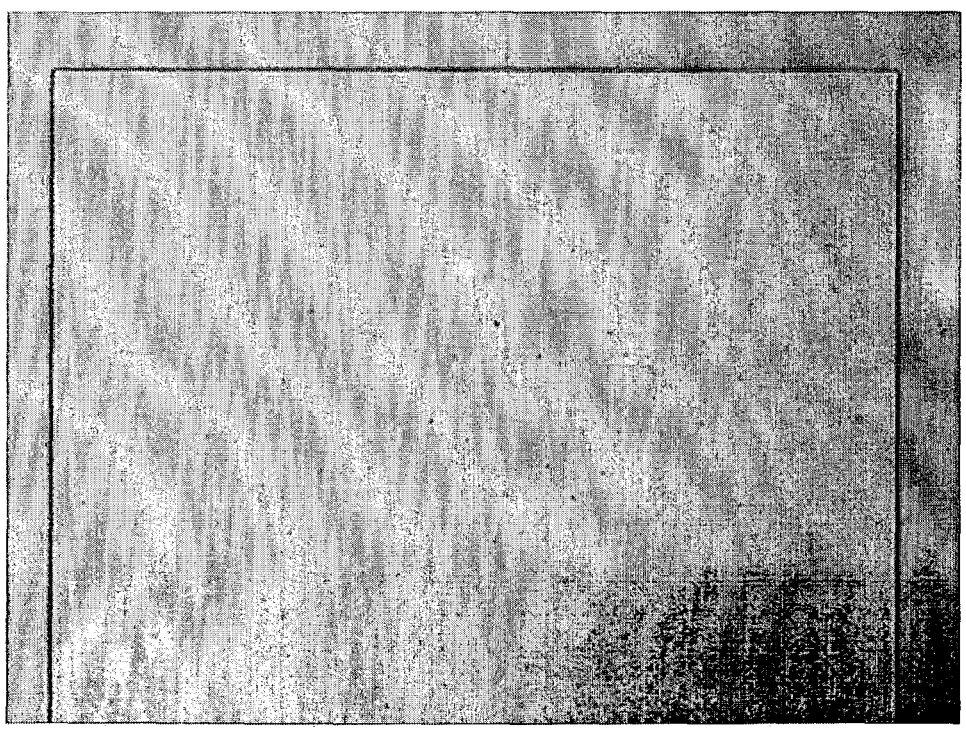

FIG. 5A shows an optical micrograph of a wafer bearing a Cu blanket having an overlying deposited nitride layer, where the wafer was placed into direct contact with the wafer heater during the entire gas flow stabilization step. FIG. 5B shows an optical micrograph of a wafer bearing a deposited Cu blanket layer having an overlying deposited nitride layer, that has been supported above the surface of the wafer heater on lift pins during the gas flow stabilization period. Comparison of FIGS. 5A and 5B reveals substantially reduced hillock formation on the wafer suspended over the heater during stabilization.

Research has indicated that bombardment of the Cu layer by ions during removal of the CuO by plasma exposure also imparts stress and relaxation in a Cu film, potentially creating hillocks. Thus another approach to reducing hillock formation in accordance with an embodiment of the present invention is to reduce ion bombardment of the Cu film during the CuO removal step.

Figure 6A:
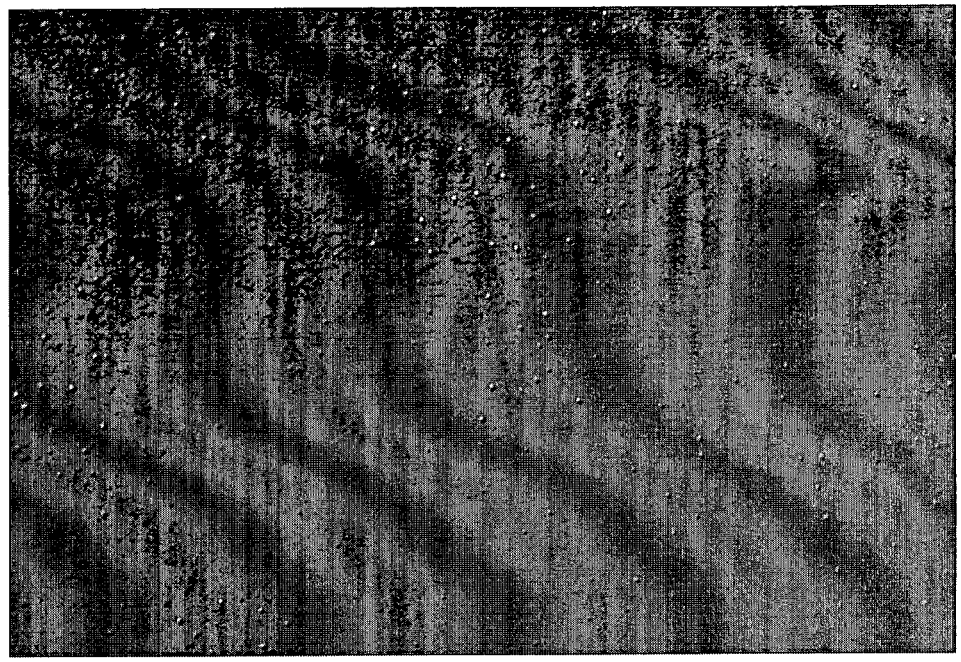
FIGS. 6A-D show optical micrographs of wafers bearing blanket Cu layers coated with deposited nitride, after exposure of the Cu layers to plasma under various pressures and gas distribution faceplate to wafer spacings.
Figure 6B:
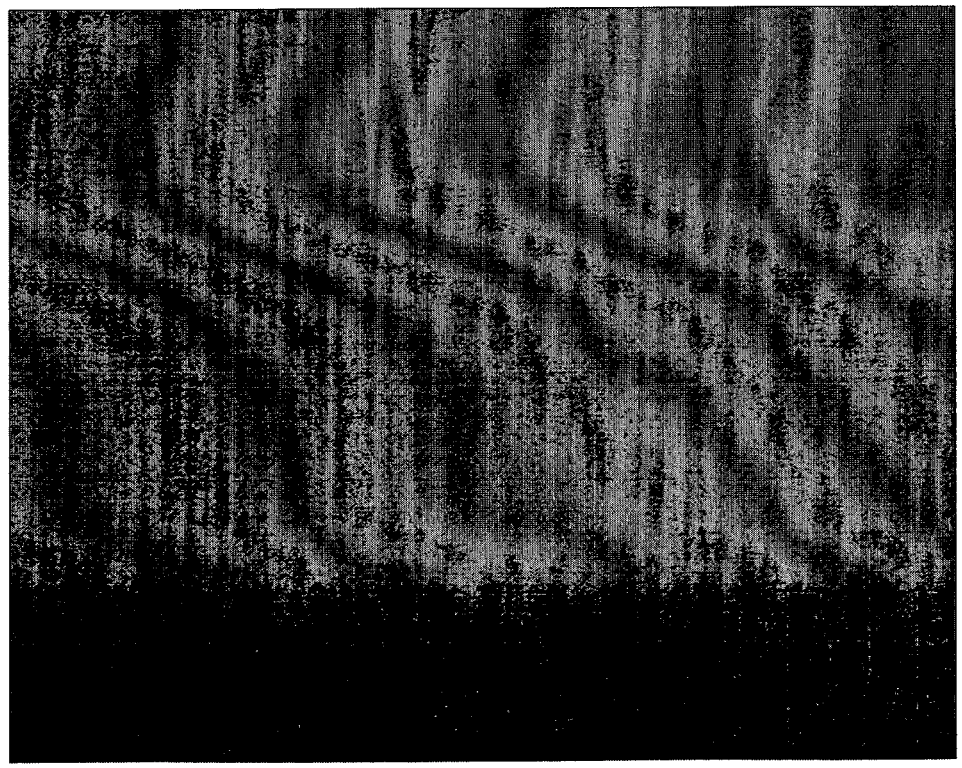
Figure 6C:
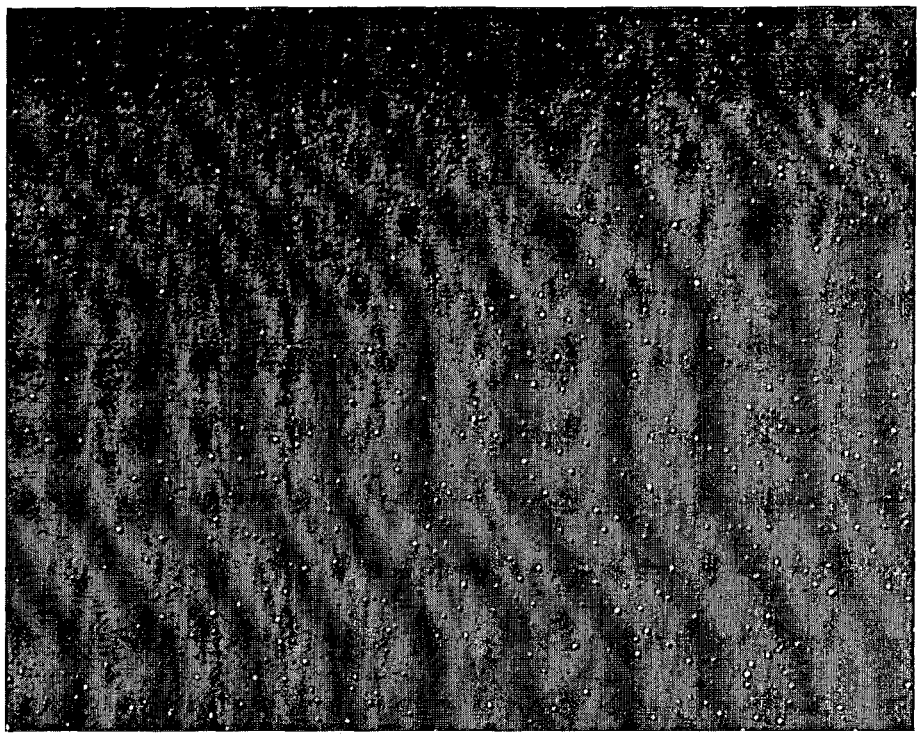
Figure 6D:
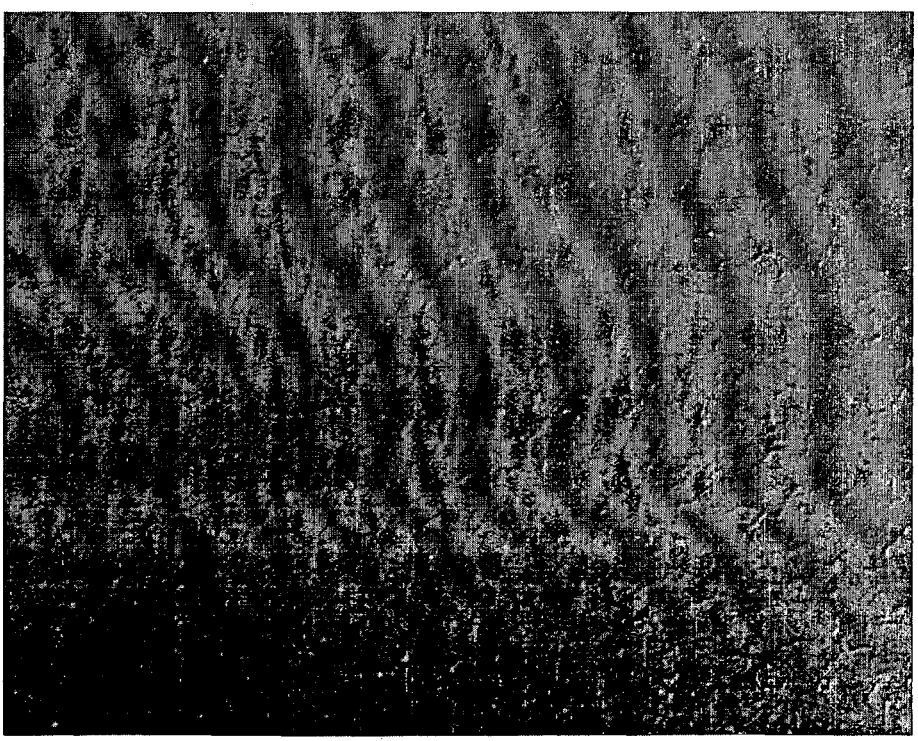

Increasing the pressure at which the plasma is generated, and the spacing between the wafer and the gas distribution face plate during the CuO plasma removal step, may serve to reduce ion bombardment. This is illustrated in connection with FIGS. 6A-D, which show optical micrographs of the surface of a wafer bearing a silicon nitride layer deposited over a blanket Cu layer that was exposed to plasma under various conditions. FIGS. 6A and 6C show edge and center portions respectively, of a wafer exposed to a plasma at a pressure of 4.2 torr and an $N_2$ gas flow of 5000 sccm, with spacing between the gas distribution face plate and the wafer of about 350 mils (0.35"). FIGS. 6B and 6D show edge and center portions respectively, of a wafer exposed to a plasma at a pressure of 8 torr and an $N_2$ gas flow of 9000 seem, with a spacing between the gas distribution face plate and the wafer of about 560 mil (0.56"). Comparison of FIG. 6A with FIG. 6B, and of FIG. 6C with FIG. 6D, indicate that significantly fewer hillocks are present on the wafer that has been subjected to oxide removal by plasma at higher pressures at larger face plate-to-wafer spacings.

Figure 7A:
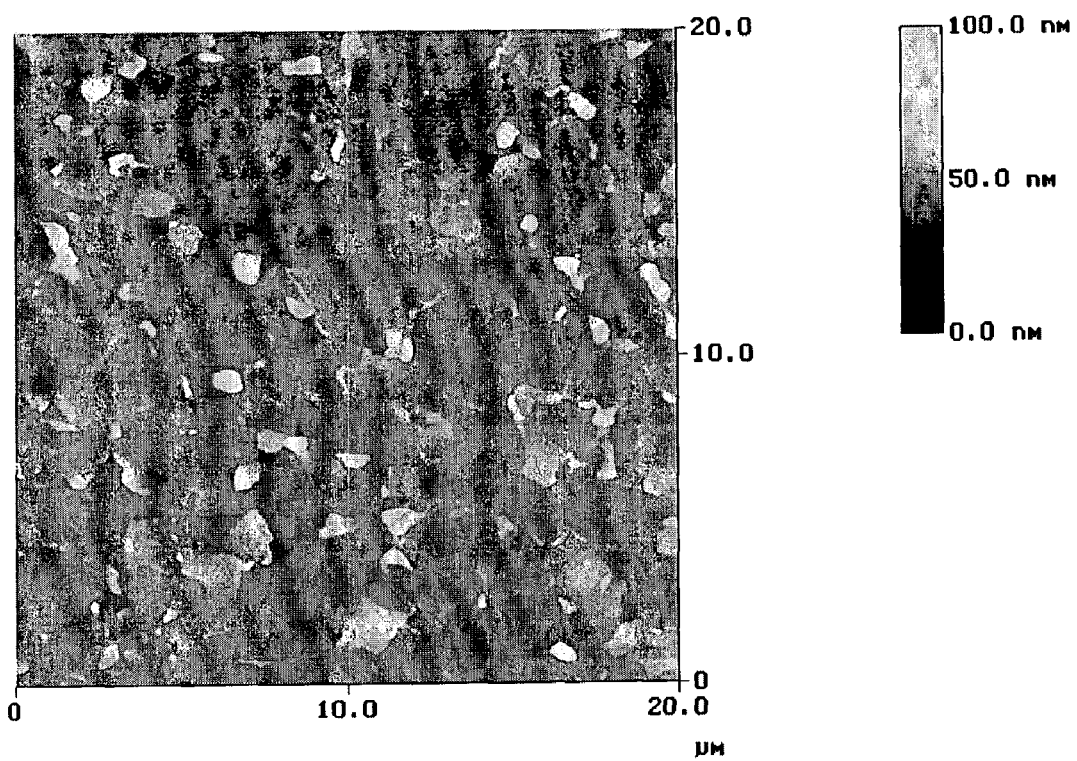
FIG. 7A-B show atomic force micrographs of wafers bearing blanket Cu layers after exposure to plasma for different durations to remove CuO.
Figure 7B:
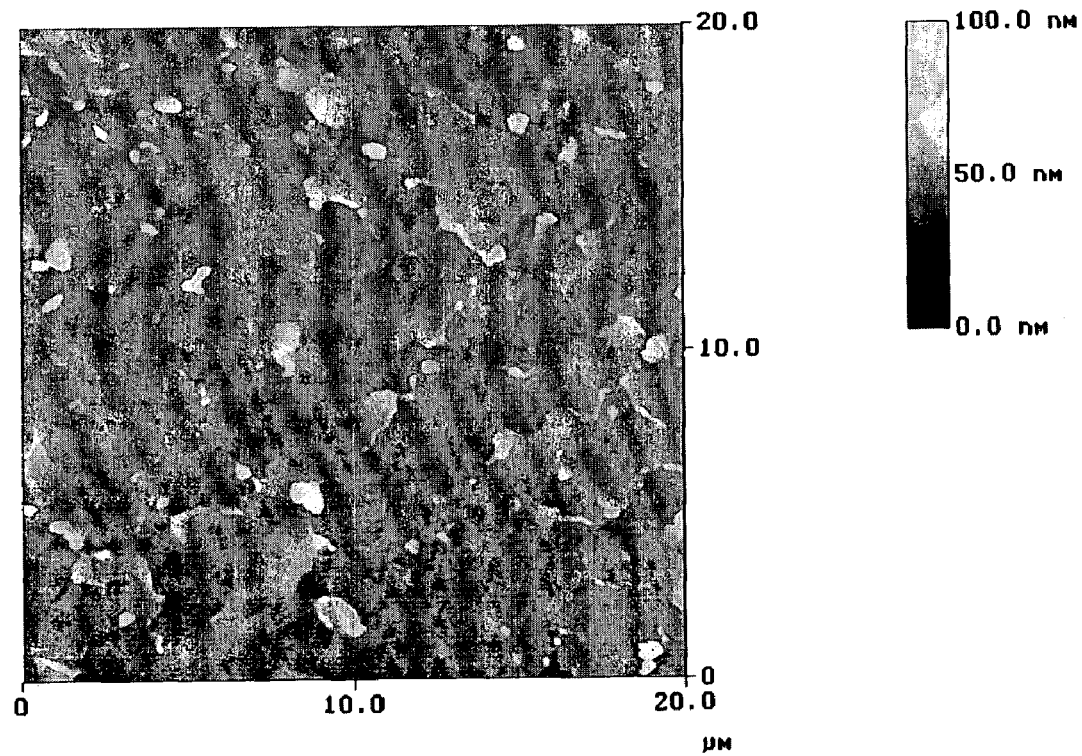

Still another approach to reducing hillock formation is to reduce the duration of the plasma treatment to remove CuO, such that the wafer is exposed to ion bombardment for a shorter period of time. FIG. 7A shows atomic force micrographs of a surface of a wafer bearing a blanket Cu layer after exposure to plasma for 15 seconds to remove CuO. The rms roughness of the layer of FIG. 7A is 4.8 nm. FIG. 7B shows atomic force micrographs of a blanket Cu layer after exposure to plasma under the same conditions as in FIG. 7A, except for a duration of only 10 seconds. The rms roughness of the layer of FIG. 7B is 4.1 nm, illustrating a reduction in the incidence of hillock formation.

Yet another approach to reducing hillock formation based upon plasma treatment to remove CuO is to control the composition of the gases present in the processing chamber during this plasma exposure step. For example, it is expected that removal of the CuO by exposure to plasma will be followed by deposition of the nitride barrier layer under plasma conditions. Hence, conventionally the step of removing the CuO through exposure to plasma takes place in a similar ambient as the subsequent deposition step, namely in an ambient containing ammonia ($NH_3$).

Figure 8A:
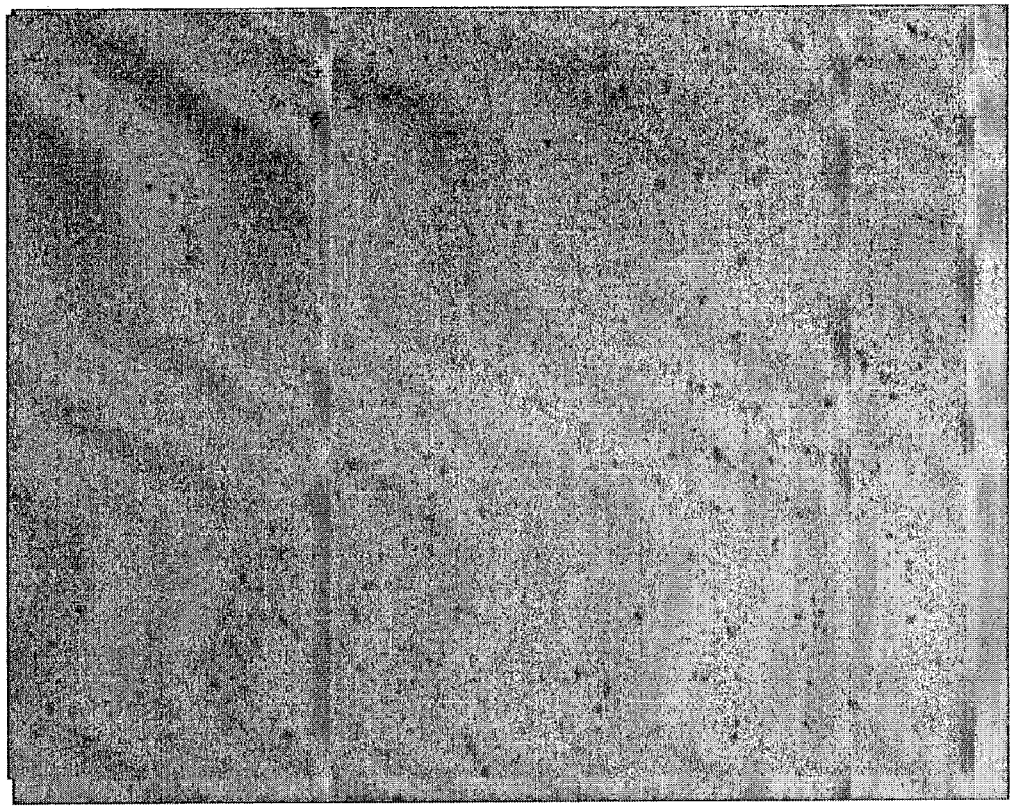
FIGS. 8A-D show optical micrographs of wafers bearing a blanket Cu layer coated with deposited nitride, after exposure of the Cu layer to plasma formed in different gases.
Figure 8B:
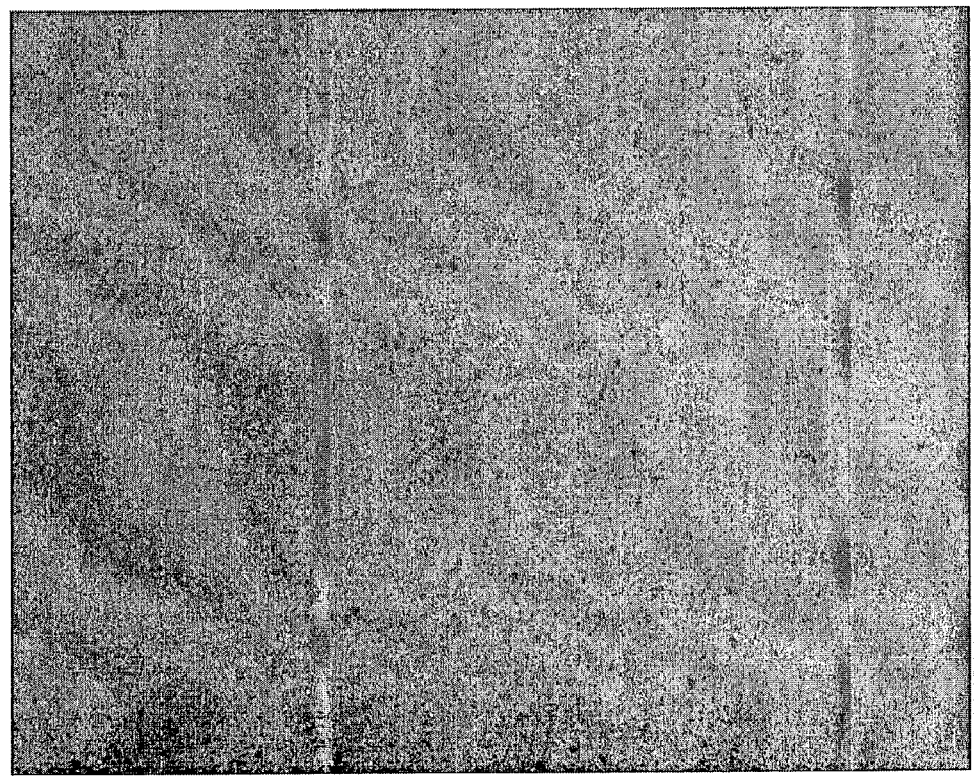
Figure 8C:
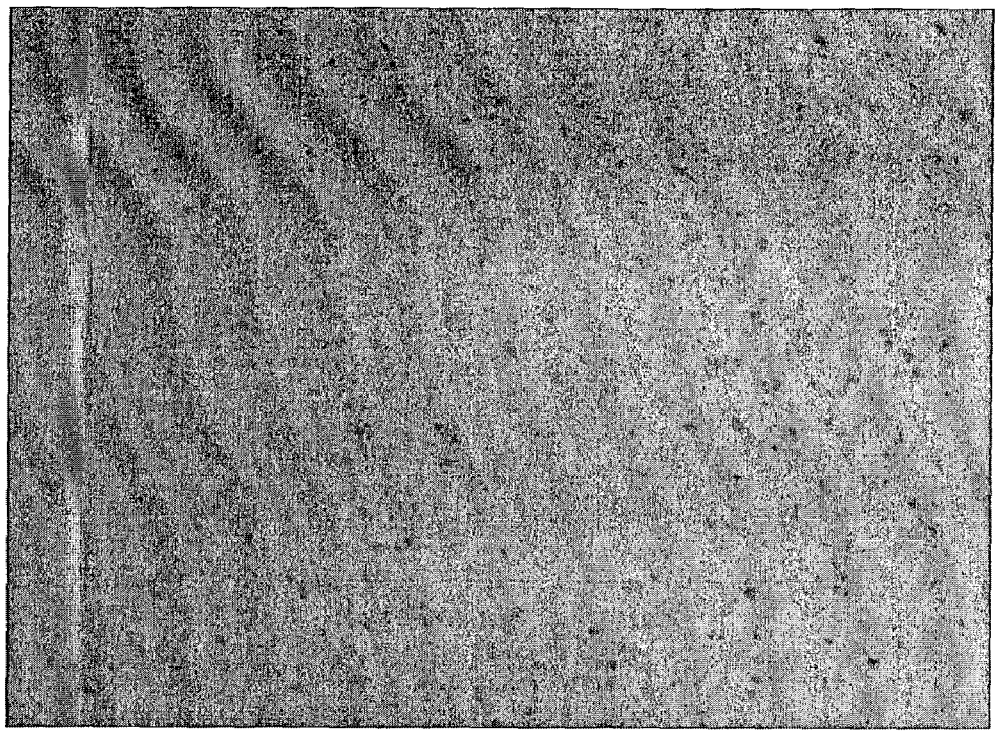
Figure 8D:
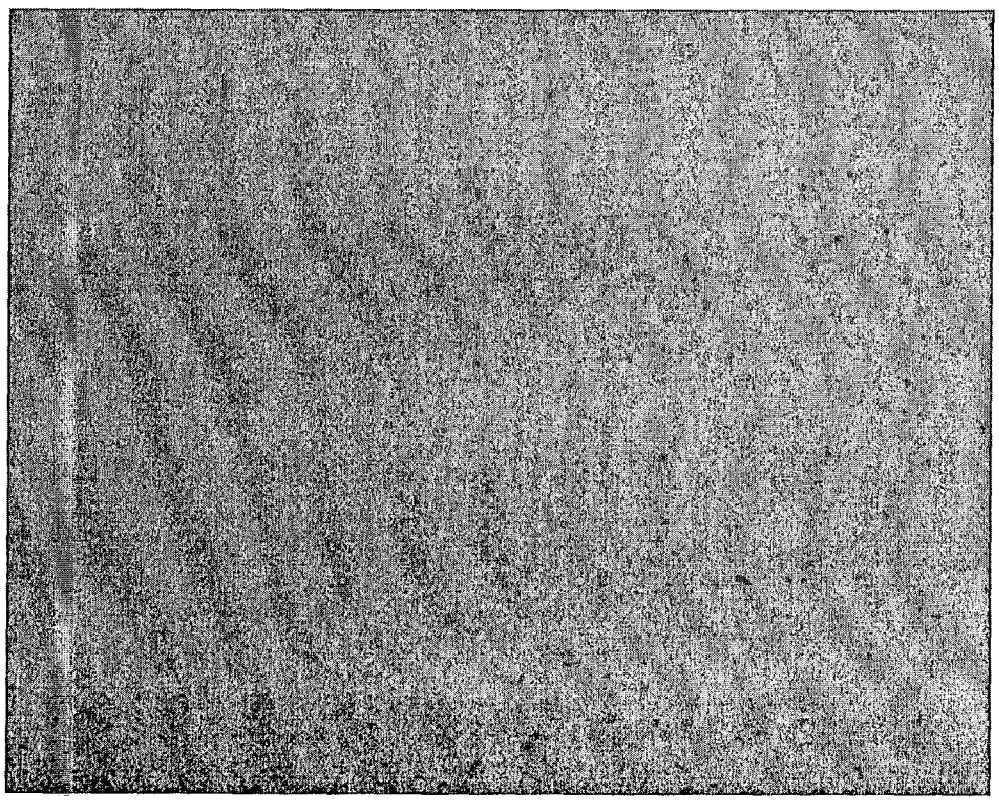

Typically however, carrier gases are also present in the chamber along with $NH_3$ during the step of removing CuO through plasma exposure. In accordance with one embodiment of the present invention, it may therefore be possible to reduce ion bombardment by performing this CuO removal step in an ambient comprising $NH_3$ only. FIGS. 8A-D show optical micrographs of the surface of wafers bearing Cu blanket layers having deposited nitride layers, after exposure of the Cu layer to plasma under various conditions. FIGS. 8A and 8C show optical micrographs of center and edge portions respectively, of the surface of wafers bearing Cu blanket layers after exposure to a plasma for 15 seconds in an ambient of $N_2$ and $NH_3$. FIGS. 8B and 8D show optical micrographs of center and edge portions respectively, of the surface of wafers bearing Cu blanket layers after exposure to a plasma in an ambient of $NH_3$ only for a longer period (20 seconds). Comparison of FIG. 8A with FIG. 8B, and of FIG. 8C with FIG. 8D, indicates that significantly fewer hillocks are present on the wafer exposed to plasma in the lower molecular weight ($NH_3$ only) ambient.

Figure 9A:
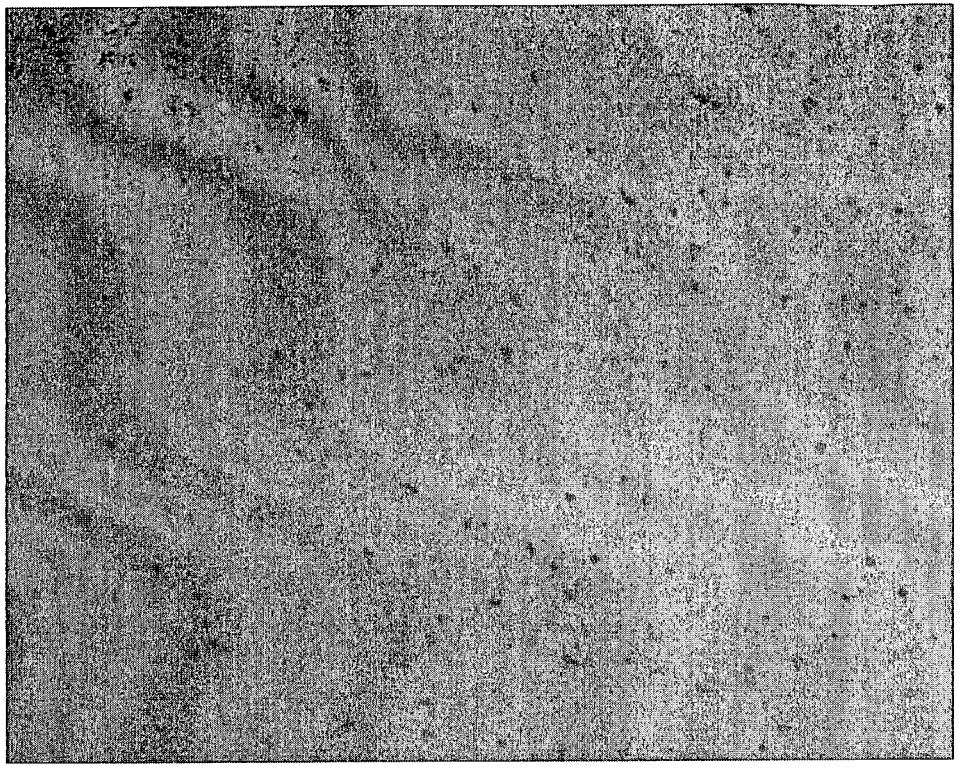
FIGS. 9A-D show optical micrographs of wafers bearing a blanket Cu layer coated with a deposited nitride layer, after exposure of the Cu layer to plasma formed in different gases.
Figure 9B:
Figure 9C:
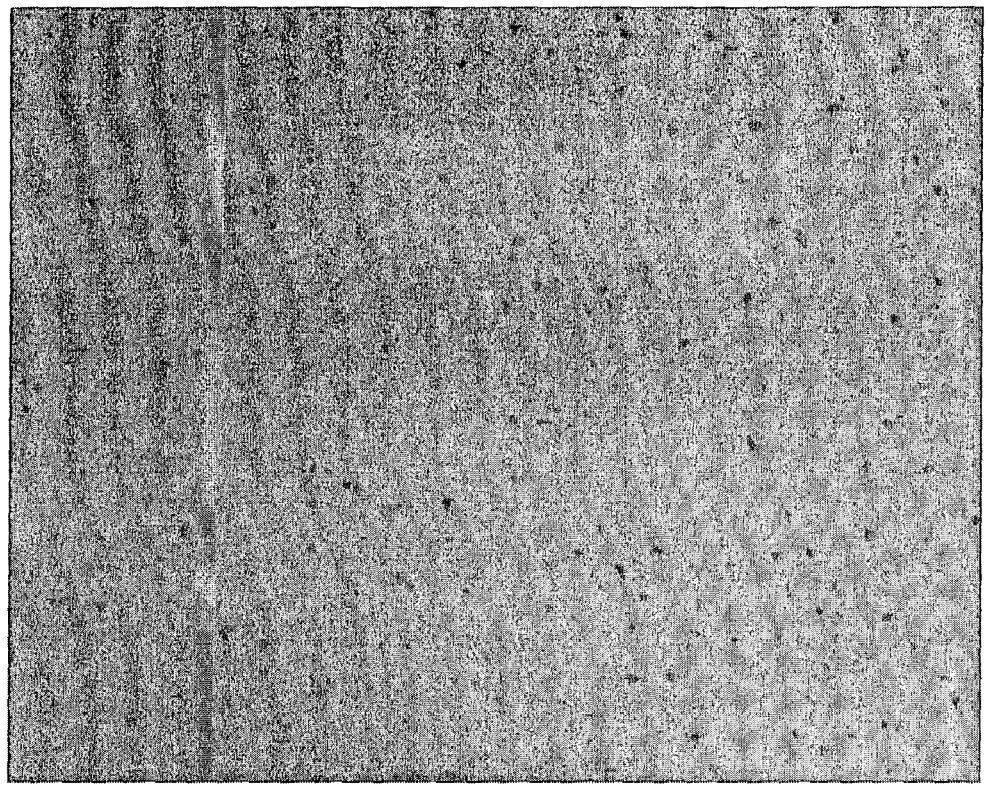
Figure 9D:
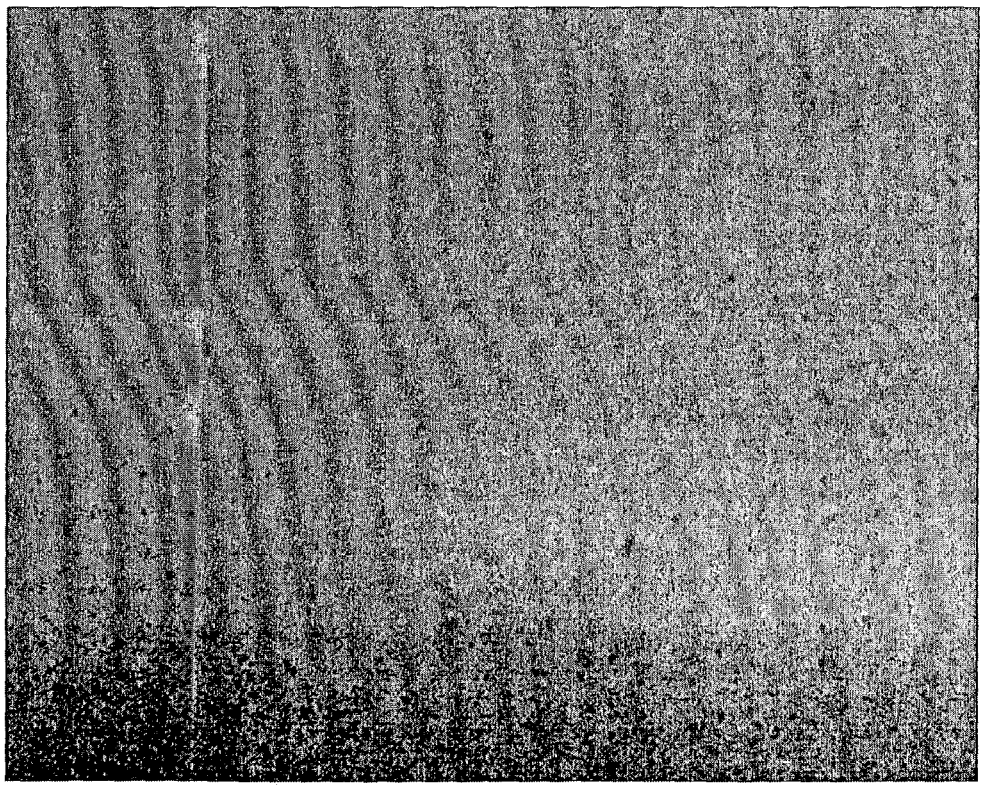

Moreover, as the role of the plasma in the CuO removal step is simply to react with and remove a thin layer of material, it may further be possible to substitute gases other than $NH_3$ during this step, and thereby further reduce the energy of ion bombardment. FIGS. 9A-D show photographs of a Cu blanket layer after exposure to plasma under various conditions. FIGS. 9A and 9C show optical micrographs of center and edge portions respectively, of the surface of wafers bearing Cu blanket layers having deposited nitride layers, where the Cu layer is exposed to a plasma for 15 seconds in a $NH_3$ ambient. FIGS. 9B and 9D show optical micrographs of center and edge portions respectively, of the surface of wafers bearing Cu blanket layers having deposited nitride layers, where the Cu layer is exposed to a plasma in an ambient comprising molecular hydrogen ($H_2$) having a substantially lower molecular weight (M.W.=2) than ammonia (M.W.=17). Comparison of FIG. 9A with FIG. 9B, and of FIG. 9C with FIG. 9D, reveals significantly fewer hillocks on the wafer exposed to the $H_2$ plasma.

C. Post-Cu Removal Processes

As shown in step 312 of FIG. 3, once the barrier layer deposition chamber has been conditioned and the CuO film removed by exposure to plasma, the chamber is operated to expose the wafer to conditions that result in deposition of a barrier layer over the Cu layer. In accordance with embodiments of the present invention, various post-CuO removal process parameters may also be controlled to minimize hillock formation.

Figure 10A:
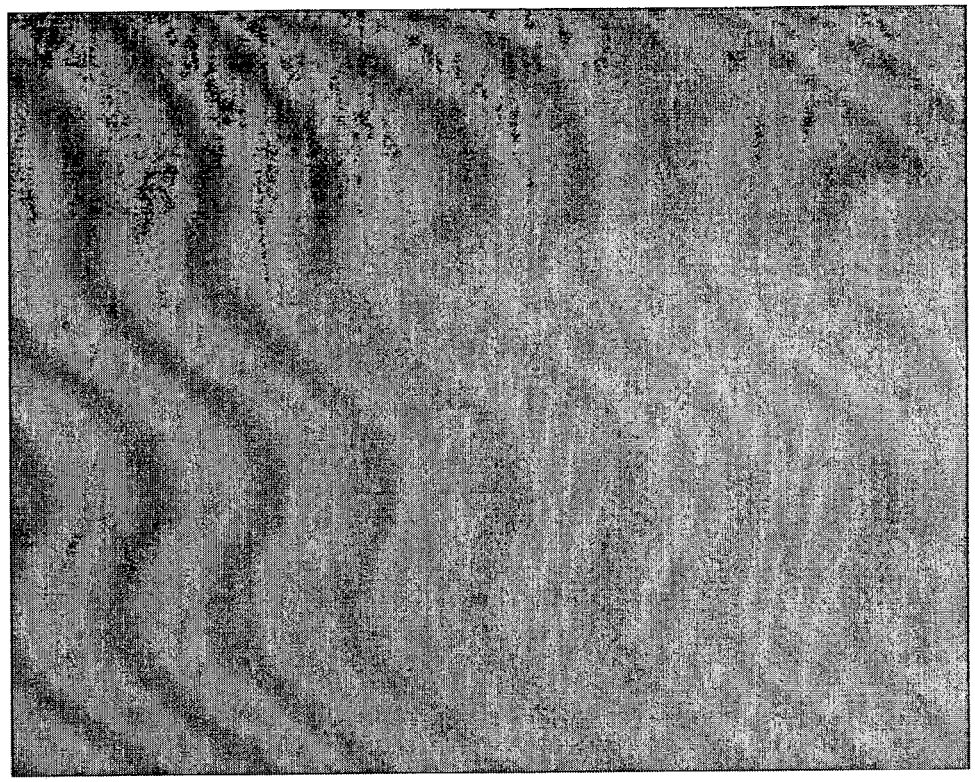
FIGS. 10A-D show optical micrographs of the surfaces of wafers exposed to different process conditions.
Figure 10B:
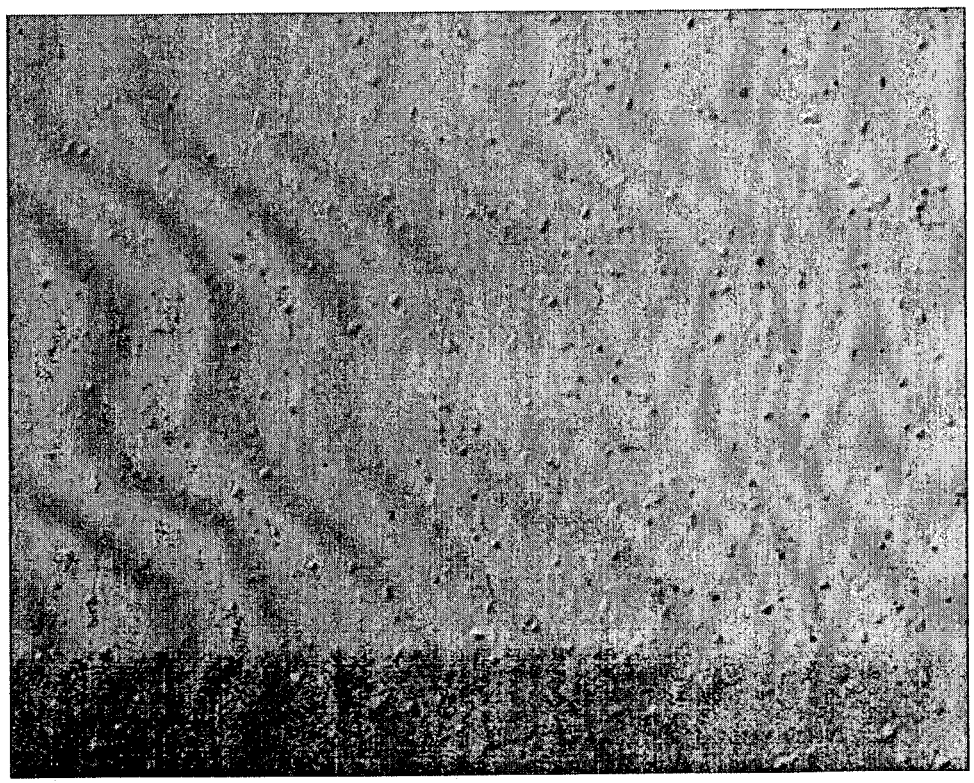

Research has indicated that the hillocks grow on the Cu layer prior to deposition of the barrier layer, and that relative stiffness of the overlying deposited barrier layer will likely act as a physical barrier to inhibit growth of hillocks out of the plane of the Cu layer. This conclusion is supported by the experimental results shown in FIGS. 10A-D. FIG. 10A shows an optical micrograph of a surface of a wafer bearing a blanket Cu layer prior to exposure of the Cu layer to any additional thermal energy. FIG. 10B shows an optical micrograph of a Cu blanket layer after the Cu layer has been heated at 400° C. for 60 seconds. Comparison of FIGS. 10A and 10B show significant hillock formation in the blanket Cu layer exposed to the thermal treatment.

Figure 10C:
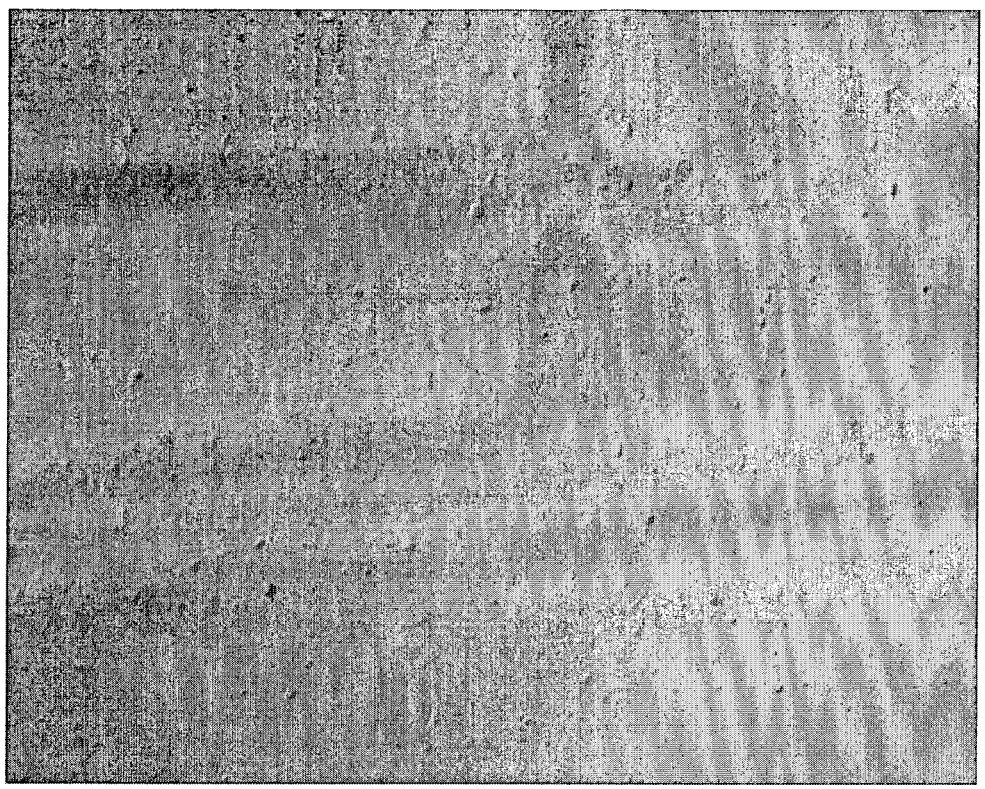
Figure 10D:
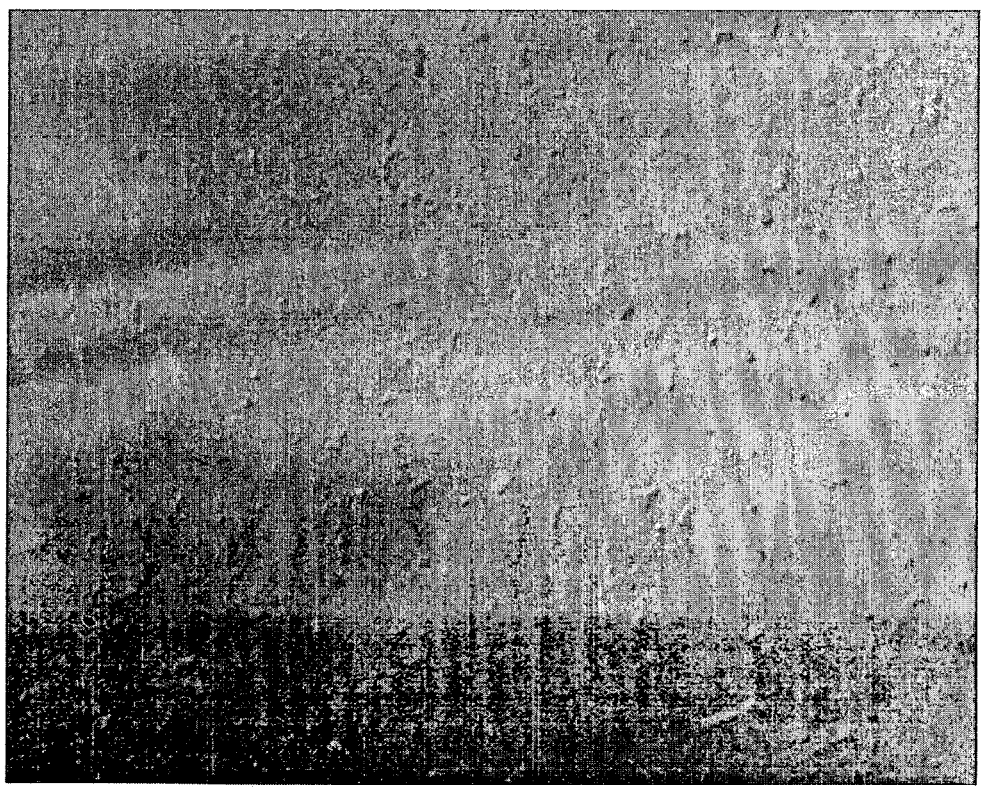

FIG. 10C shows an optical micrograph of a surface of a wafer bearing a nitride layer deposited over a Cu blanket layer prior to any heating of the Cu blanket layer. FIG. 10D shows an optical micrograph of a Cu blanket layer bearing a deposited nitride layer, after the Cu/SiN stack has been exposed to thermal treatment at 450° C. for 60 seconds. Comparison of FIGS. 10C and 10D show little significant hillock formation in the presence of the overlying nitride barrier layer. Thus in accordance with embodiments of the present invention, hillock growth can be suppressed by forming an overlying nitride layer prior to exposing the copper layer to additional thermal energy.

In one approach, thermal exposure of the Cu film immediately prior to barrier layer deposition may be minimized by reducing the time required for stabilization of the process gas. For some period prior to plasma reaction of the reactant gases to form the layer of the barrier material over the Cu metallization layer, some or all of the reactant gases may be flowed with the wafer present in the chamber in order to stabilize the gas flow rate. During this pre-deposition gas flow stabilization phase, the wafer is exposed to high temperatures and hence energy and stress may be imparted to the film. By reducing the duration of this gas flow stabilization phase, for example from 15 sec. to 5 sec. for deposition of a SiN barrier layer on a 200 mm wafer, or from 30 sec to 15 sec for deposition of a SiN barrier layer on a 300 mm wafer, the incidence of hillock formation can be substantially suppressed.

Figure 11A:
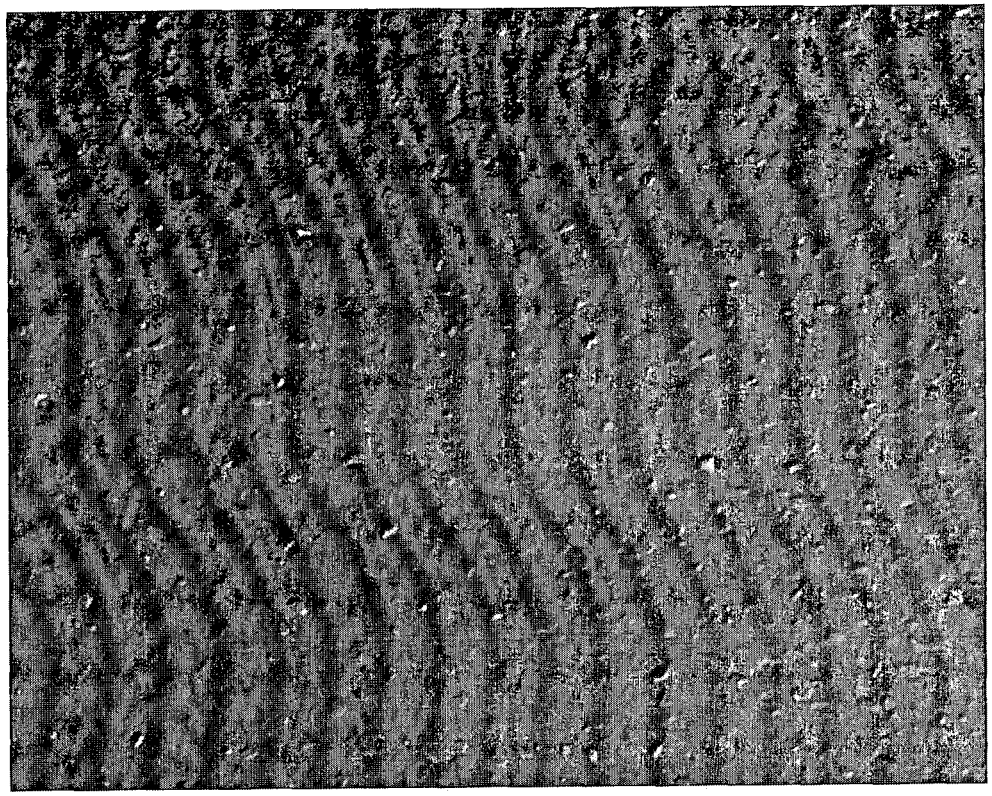
FIGS. 11A-B show optical micrographs of wafers bearing a nitride barrier deposited over a Cu blanket layer at different temperatures.
Figure 11B:
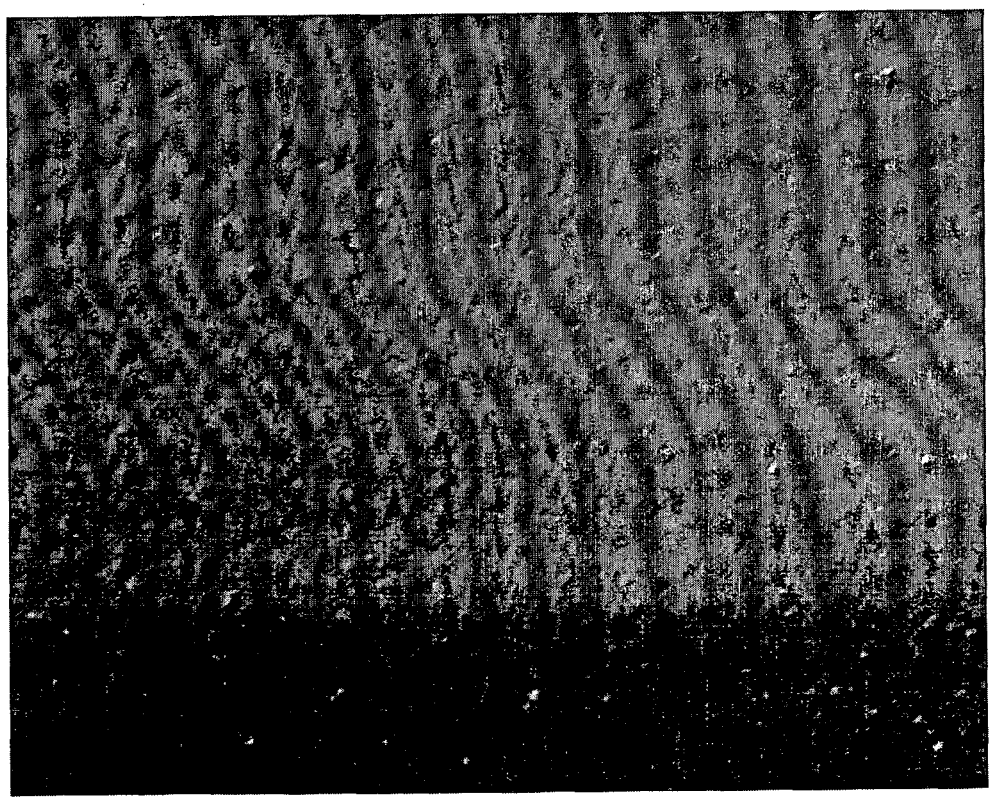

Another approach for reducing hillock formation during barrier layer deposition is to reduce the temperature at witch deposition takes place. FIG. 11A shows an optical micrograph of the surface of a wafer bearing a nitride layer deposited over a Cu blanket layer at a temperature of 400° C. Under these conditions, the nitride layer exhibited an rms roughness of 6.2 nm. FIG. 11B shows an optical micrograph of the surface of a wafer bearing a nitride layer deposited over a Cu blanket layer at a temperature of 350° C. for the same period of time as the wafer of FIG. 11A. Under deposition at these reduced temperature conditions, the nitride layer exhibited an rms roughness of 5.4 nm, a reduction of 10-20% relative to the sample exposed to 400° C. in FIG. 11A. Comparison of FIGS. 11A and 11B reveals that the wafer exposed to the lower temperature exhibited less roughness and reduced hillock formation.

II. Processing Apparatuses

Embodiments of the invention may be performed in the processing chamber of any suitable processing apparatus, such as the PRODUCER® plasma enhanced chemical vapor deposition (PECVD) apparatus manufactured by Applied Materials Inc., of Santa Clara, Calif. In a PECVD apparatus, process gases are excited and/or dissociated by the application of energy such as radio frequency (RF) energy to form a plasma. The plasma contains ions of the process gases and reacts at the surface of the substrate to form a layer of material.

Figure 12A:
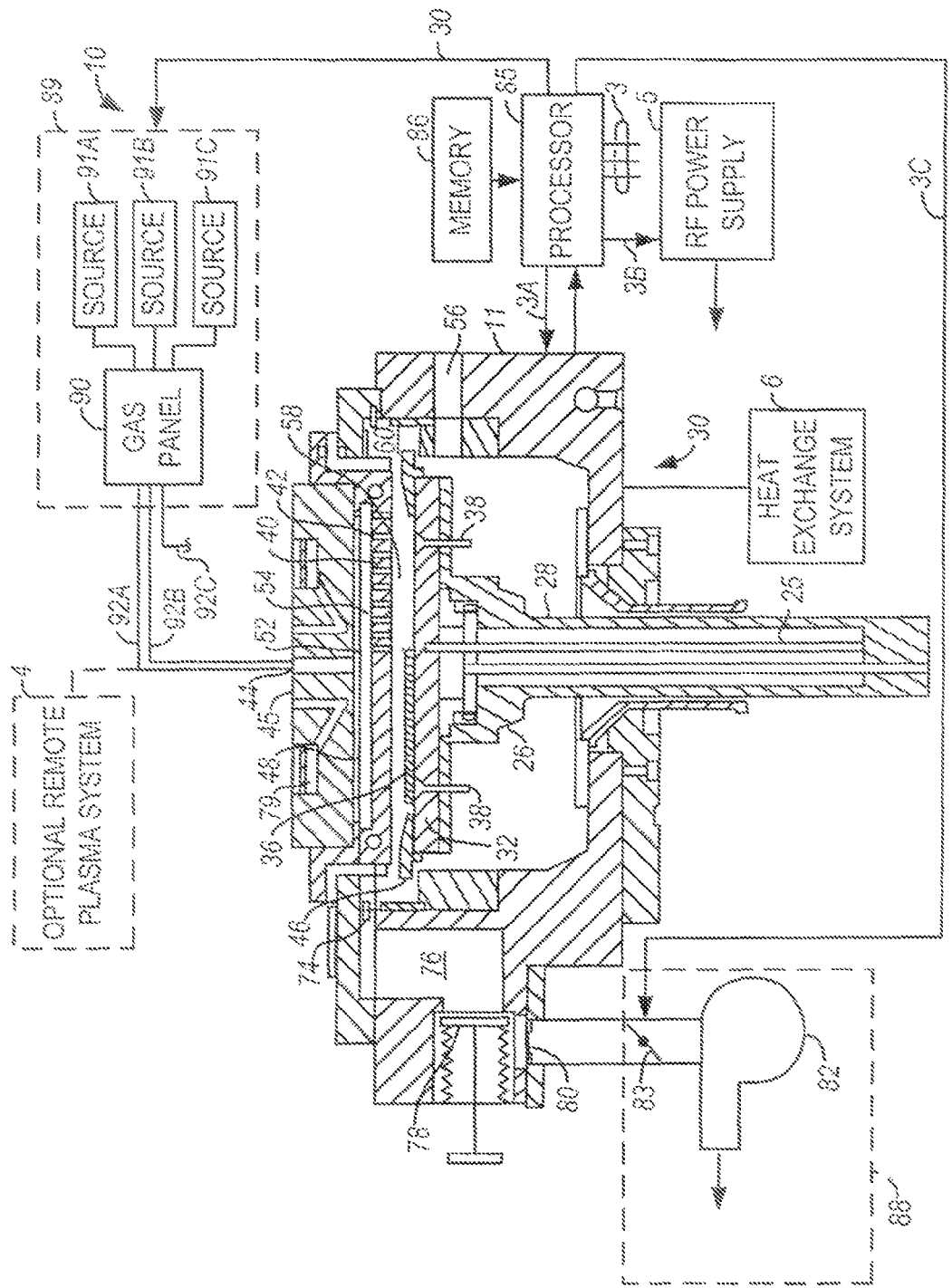
FIG. 12A shows a simplified cross-sectional view of one embodiment of a PECVD apparatus.

An example of a PECVD apparatus is shown in FIG. 12A. FIG. 12A shows a system 10 including a processing chamber 30, a vacuum system 88, a gas delivery system 89, an RF power supply 5, a heat exchanger system 6, a substrate pedestal/heater 32 and a processor 85 among other major components. A gas distribution manifold (also referred to as an inlet manifold, a face plate, or "showerhead") 40 introduces process gases supplied from the gas delivery system 89 into a reaction zone 58 of the processing chamber 30. The heat exchange system 6 may employ a liquid heat exchange medium, such as water or a water-glycol mixture, to remove heat from the processing chamber 30 and maintain certain portions of the processing chamber 30 at a suitable temperature.

The gas delivery system 89 delivers gases to the processing chamber 30 via gas lines 92A-C. The gas delivery system 89 includes a gas supply panel 90 and gas or liquid or solid sources 91A-C (additional sources may be added if desired), containing gases (such as $SiH_4$, ozone, halogenated gases, or $N_2$) or liquids (such as TEOS) or solids. The gas supply panel 90 has a mixing system that receives the process gases and carrier gases (or vaporized liquids) from the sources 91A-C. Process gases may be mixed and sent to a central gas inlet 44 in a gas feed cover plate 45 via the supply lines 92A-C (other lines may be present, but are not shown).

Process gas is injected into processing chamber 30 through the central gas inlet 44 in the gas-feed cover plate 45 to a first disk-shaped space 48. Heat exchanger passages 79 may be provided in the cover plate 45 to maintain the cover plate 45 at a desired temperature. The process gas passes through passageways (not shown) in a baffle plate (or gas blocker plate) 52 to a second disk-shaped space 54 and then to the showerhead 40. The showerhead 40 includes a large number of holes or passageways 42 for supplying the process gas into reaction zone 58. Process gas passes from the holes 42 in the showerhead 40 into the reaction zone 58 between the showerhead 40 and the pedestal 32. Once in the reaction zone 58, the process gas reacts on the wafer 36. Byproducts of the reaction then flow radially outward across the edge of the wafer 36 and a flow restrictor ring 46, which is disposed on the upper periphery of pedestal 32. Then, the process gas flows through a choke aperture formed between the bottom of an annular isolator and the top of chamber wall liner assembly 53 into a pumping channel 60.

The vacuum system 88 maintains a specified pressure in the process chamber 30 and removes gaseous byproducts and spent gases from the process chamber 30. The vacuum system 88 includes a vacuum pump 82 and a throttle valve 83. Upon entering the pumping channel 60, the exhaust gas is routed around the perimeter of the processing chamber 30, and is evacuated by a vacuum pump 82. The pumping channel 60 is connected through the exhaust aperture 74 to a pumping plenum 76. The exhaust aperture 74 restricts the flow between the pumping channel 60 and the pumping plenum 76. A valve 78 gates the exhaust, through an exhaust vent 80 to the vacuum pump 82.

The pedestal 32 may be made of ceramic and may include an embedded RF electrode (not shown), such as an embedded molybdenum mesh. A heating element such as a resistive heating element (e.g., an embedded molybdenum wire coil) or a coil containing a heating fluid may also be in the pedestal 32. Alternatively or additionally, a cooling element (not shown) may be included in the pedestal 32. The pedestal 32 may be made from aluminum nitride and is preferably diffusion bonded to a ceramic support stem 26 that is secured to a water cooled aluminum shaft 28 that engages a lift motor (not shown). The ceramic support stem 26 and the aluminum shaft 28 have a central passage that is occupied by a nickel rod 25 that transmits low frequency RF power to the embedded electrode.

The pedestal 32 may support the wafer 36 in a wafer pocket 34 when the wafer 36 is on the pedestal 32. The pedestal 32 may move vertically and may be positioned at any suitable vertical position. For example, when the pedestal 32 is in a lower loading position (slightly lower than at slit valve 56), a robot blade (not shown) in cooperation with the lift pins 38 and a lifting ring transfers the wafer 36 in and out of chamber 30 through a slit valve 56. The slit valve 56 vacuum-seals the processing chamber 30 to prevent the flow of gas into or out of the processing chamber 30. When the pedestal 32 is disposed in a lower position, the lift pins 38 (which may be stationary) support the wafer 36. The robot blade (not shown) used to transfer the wafer 36 into the chamber is withdrawn. The wafer 36 may remain on the lift pins 38 so that the wafer 36 can be processed according to the first process. The pedestal 32 may rise to raise the wafer 36 off the lift pins 38 onto the upper surface of the pedestal 32 so that the wafer 36 can be heated to a second temperature suitable for a second process. The pedestal 32 may further raise the wafer 36 so that the wafer 36 is any suitable distance from the gas distribution manifold 40.

Motors and optical sensors (not shown) may be used to move and determine the position of movable mechanical assemblies such as the throttle valve 83 and the pedestal 32. Bellows (not shown) attached to the bottom of the pedestal 32 and the chamber body 11 form a movable gas-tight seal around the pedestal 32. The processor 85 controls the pedestal lift system, motors, gate valve, plasma system, and other system components over control lines 3 and 3A-C. The processor 85 may execute computer code for controlling the apparatus. A memory 86 coupled to the processor 85 may store the computer code. The processor 85 may also control a remote plasma system 4. In some embodiments, the remote plasma system 4 may include a microwave source and may be used to form a plasma that can be used to clean the process chamber 30 or process the wafer 36. Computer code may be used to control chamber components that may be used to load the wafer 36 onto the pedestal 32, lift the wafer 36 to a desired height in the chamber 30, control the spacing between the wafer 36 and the showerhead 40, and keep the lift pins 38 above the upper surface of the pedestal 32.

Figure 12B:
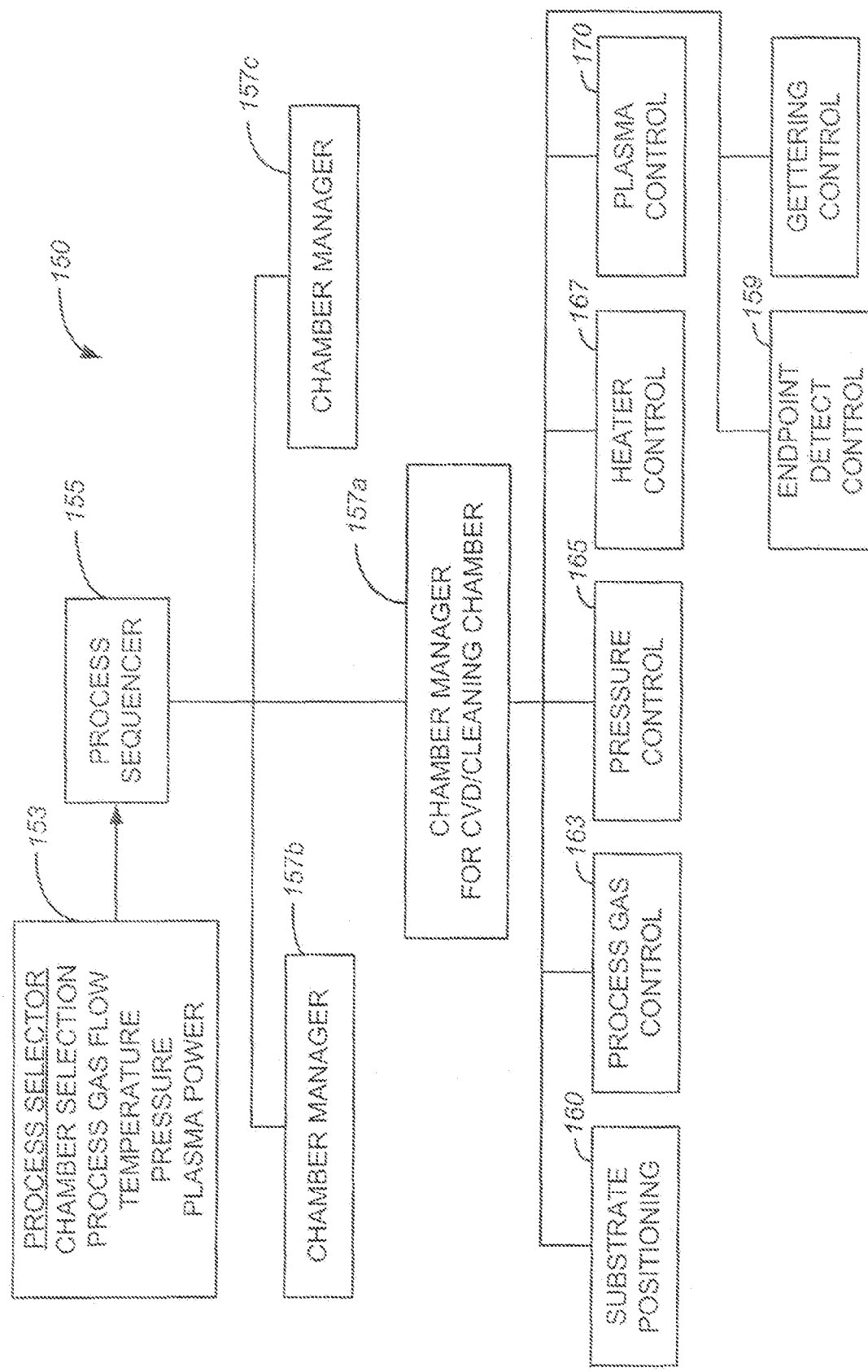
FIG. 12B is an illustrative block diagram of the hierarchical control structure of the system control software according to a specific embodiment.

FIG. 12B is an illustrative block diagram of the hierarchical control structure of the system control software, computer program 150, according to a specific embodiment. A processes for depositing a film, performing a clean, or performing reflow or drive-in can be implemented using a computer program product that is executed by the processor 85. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled WINDOWS™ library routines. To execute the linked compiled object code, the user invokes the object code, causing the computer system to load the code in memory, from which the CPU reads and executes the code to configure the apparatus to perform tasks identified in the program.

A user enters a process set number and process chamber number into a process selector subroutine 153 by using the light pen to select a choice provided by menus or screens displayed on a CRT monitor. The process sets, which are predetermined sets of process parameters necessary to carry out specified processes, are identified by predefined set numbers. The process selector subroutine 153 identifies the desired set of process parameters needed to operate the process chamber for performing the desired process. The process parameters for performing a specific process relate to process conditions such as, for example, process gas composition and flow rates, temperature, pressure, plasma conditions such as magnetron power levels (and alternatively to or in addition to high- and low-frequency RF power levels and the low-frequency RF frequency, for embodiments equipped with RF plasma systems), cooling gas pressure, and chamber wall temperature. The process selector subroutine 153 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 155 has program code for accepting the identified process chamber and process parameters from the process selector subroutine 153, and for controlling the operation of the various process chambers. Multiple users can enter process set numbers and process chamber numbers, or a single user can enter multiple process set numbers and process chamber numbers, so process sequencer subroutine 155 operates to schedule the selected processes in the desired sequence. Preferably, the process sequencer subroutine 155 includes program code to perform the tasks of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, the process sequencer subroutine 155 can be designed to take into consideration the present condition of the process chamber being used in comparison with the desired process conditions for a selected process, or the "age" of each particular user-entered request, or any other relevant factor a system programmer desires to include for determining scheduling priorities.

Once the process sequencer subroutine 155 determines which process chamber and process set combination is going to be executed next, the process sequencer subroutine 155 initiates execution of the process set by passing the particular process set parameters to a chamber manager subroutine 157a-c which controls multiple processing tasks in the process chamber according to the process set determined by the process sequencer subroutine 155. For example, the chamber manager subroutine 157a has program code for controlling CVD and cleaning process operations in the process chamber. Chamber manager subroutine 157 also controls execution of various chamber component subroutines which control operation of the chamber components necessary to carry out the selected process set. Examples of chamber component subroutines are substrate positioning subroutine 160, process gas control subroutine 163, pressure control subroutine 165, heater control subroutine 167, plasma control subroutine 170, endpoint detect control subroutine 159, and gettering control subroutine 169.

Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in the process chamber.

In operation, the chamber manager subroutine 157a selectively schedules or calls the process component subroutines in accordance with the particular process set being executed. The chamber manager subroutine 157a schedules the process component subroutines much like the process sequencer subroutine 155 schedules which process chamber and process set are to be executed next. Typically, the chamber manager subroutine 157a includes the steps of monitoring the various chamber components, determining components to be operated based on the process parameters for the process set to be executed, and initiating execution of a chamber component subroutine responsive to the monitoring and determining steps.

Operation of particular chamber component subroutines will now be described with reference to FIGS. 12A-B. The substrate positioning subroutine 160 comprises program code for controlling chamber components that are used to load the substrate onto the heater 32 and, optionally, to lift the substrate to a desired height in the chamber to control the spacing between the substrate and the gas distribution face plate. When a substrate is loaded into the process chamber 30, the heater 32 is lowered to receive the substrate and then the heater 32 is raised to the desired height. In operation, the substrate positioning subroutine 160 controls movement of the heater 32 in response to process set parameters related to the support height that are transferred from the chamber manager subroutine 157a. As discussed above, in certain embodiments the substrate positioning subroutine 160 may be used to vary the height of the heater, and thus the spacing between the heater and the gas distribution plate 40, during the post-seasoning plasma treatment to heat the face plate and thereby reduce the steepness of the thermal gradient between the face plate and a wafer positioned on the heater. As also discussed above, in certain other embodiments the substrate positioning subroutine 160 may be used to suspend the substrate on lift pins at a height over the heater surface during gas stabilization, thereby reducing the thermal budget of the wafer during this step.

Process gas control subroutine 163 controls the character of the process gases flowed into the chamber. Process gas control subroutine 163 can be designed to vary over time the relative flow rates of the various process gases inlet to the chamber, and hence the pressure within the chamber. Such variation in pressure can result in desirable processing to suppress formation of hillocks, as has been described above.

The process gas control subroutine 163 has program code for controlling process gas composition and flow rates, for example to flow only ammonia or low molecular weight gases to reduce ion bombardment during the plasma exposure step to remove CuO. The process gas control subroutine 163 controls the state of safety shut-off valves, and also ramps the mass flow controllers up or down to obtain the desired gas flow rate. Typically, the process gas control subroutine 163 operates by opening the gas supply lines and repeatedly (i) reading the necessary mass flow controllers, (ii) comparing the readings to the desired flow rates received from the chamber manager subroutine 157a, and (iii) adjusting the flow rates of the gas supply lines as necessary. Furthermore, the process gas control subroutine 163 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or helium, is flowed into the chamber to stabilize the pressure in the chamber before reactive process gases are introduced. For these processes, process gas control subroutine 163 is programmed to include steps for flowing the inert gas into the chamber for an amount of time necessary to stabilize the pressure in the chamber, and then the steps described above would be carried out.

The pressure control subroutine 165 comprises program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 165 is invoked, the desired or target pressure level is received as a parameter from the chamber manager subroutine 157a. The pressure control subroutine 165 measures the pressure in the chamber by reading one or more conventional pressure manometers connected to the chamber, compares the measure value(s) to the target pressure, obtains proportional, integral, and differential ("PID") values corresponding to the target pressure from a stored pressure table, adjusting the throttle valve according to these values.

Alternatively, the pressure control subroutine 165 can be written to open or close the throttle valve to a particular aperture size, i.e. a fixed position, to regulate the pressure in the chamber. Controlling the exhaust capacity in this way does not invoke the feedback control feature of the pressure control subroutine 165.

The heater control subroutine 167 comprises program code for controlling the current to a heating unit that is used to heat the substrate. The heater control subroutine 167 is also invoked by the chamber manager subroutine 157a and receives a target, or set-point, temperature parameter. As discussed above, in certain embodiments this temperature preset may be zero during the barrier layer deposition step to reduce thermal stress on the wafer. The heater control subroutine 167 measures the temperature by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. The heater control subroutine 167 includes the ability to gradually control a ramp up or down of the heater temperature. This feature helps to reduce thermal cracking in the ceramic heater. Additionally, a built-in fail-safe mode can be included to detect process safety compliance, and can shut down operation of the heating unit if the process chamber is not properly set up.

The plasma control subroutine 170 comprises program code for controlling the application of rf power that is used to strike and maintain a plasma within the chamber. As discussed above, in connection with certain embodiments the plasma control subroutine 170 may direct the application of a power to generate a low density plasma within the chamber following cleaning and seasoning. Plasma control subroutine 170 may also direct the application of power to generate the subsequent plasmas utilized for CuO removal and barrier layer deposition.

To summarize: utilizing the techniques of the present invention alone or in combination, the incidence of hillock formation in copper layers of processed semiconductor wafers can be significantly reduced. This result was accomplished by controlling a first set of process parameters to condition the barrier layer deposition chamber prior to insertion of the wafer bearing the copper layer. Examples of this first set of process parameters include but are not limited to seasoning the deposition chamber with an oxide layer, and post-seasoning treatment of the chamber with plasma to densify the seasoning layer present therein.

A second set of process parameters may be controlled to minimize the energy to which the copper layer is exposed during removal of an overlying residual copper oxide layer. Examples of this second set of process parameters include but are not limited to the pressure and showerhead-to-wafer spacing during generation of an oxide removal plasma, the composition of gases present during this plasma exposure step, and the duration and position of the wafer during the gas flow stabilization step immediately preceding plasma formation.

Finally, a third set of process parameters may be controlled to minimize the thermal budget to which the copper layer is exposed during formation of the barrier layer. Examples of this third set of process parameters include but are not limited to the temperature preset of the wafer heater, the duration of gas flow stabilization, and the deposition temperature.

The above-described experimental results were obtained utilizing a Applied Materials PRODUCER® system. As a person of ordinary skill in the art would understand however, techniques for minimizing hillock formation in accordance with embodiments of the present invention are not limited to this particular apparatus, and could be employed in conjunction with other systems.

The above description is illustrative and not restrictive, and as such the process parameters listed above should not be limiting to the claims as described herein. For example, the various techniques employed for reducing hillock formation are separate and distinct, and thus it should be recognized that they may be employed alone or in various combinations to reduce the incidence of hillock formation.

In addition, while the embodiment described above discusses removal of the CuO layer through plasma exposure in the same chamber as subsequent deposition of the barrier layer, this is not required by the present invention. Alternative embodiments in accordance with the present invention could remove the CuO film through plasma exposure in a separate processing chamber, with transfer of the wafer to the barrier deposition chamber accomplished under non-oxidizing conditions to prevent the CuO film from re-forming. In such an embodiment, two distinct periods of gas flow stabilization would be used, with the duration of one or more of these periods reduced to minimize stress on the wafer. In addition, the inserted wafer could be suspended above the heater surface on lift pins during one or both of these periods of gas flow stabilization.

Moreover, while the invention has been illustrated above with particular reference to the reduction of the incidence of hillock formation in copper metallization layers following formation of a barrier layer comprising silicon nitride, one of ordinary skill in the art would recognize that the present invention is not limited to this particular type of dielectric barrier layer. Methods and apparatuses in accordance with embodiments of the present invention apply to silicon nitride, silicon carbide, SiCN, oxygen doped SiC, and other dielectric barrier materials such as the BLOK® and Black Diamond® materials produced by Applied Materials, Inc.

While the above discussion has focused upon the reduction of incidence of hillock formation during the formation of copper metallization layers utilized in the formation of damascene interconnect structures, the present invention is not limited to this particular type of metallization material or application. Rather, embodiments in accordance with the present invention are generally applicable to controlling the microstructure of other metals utilized in other metallization schemes.

The scope of the invention may be determined with reference to the above description and to the appended claims, along with their full scope of equivalents.

What is claimed is:

1. A method of fabricating a copper metallization structure, the method comprising:
    disposing a wafer bearing a planarized copper metallization layer in a processing chamber;
    exposing the wafer to a plasma in the processing chamber to remove a residual copper oxide layer overlying the planarized copper metallization layer, the plasma formed from an ambient consisting essentially of ammonia and at least one of helium and hydrogen.

2. The method of claim 1 further comprising supporting the wafer over a surface of a heater during stabilization of a flow of the gases of the ambient into the processing chamber.

3. The method of claim 1 farther comprising depositing a barrier layer on top of the planarized copper metallization layer following removal of the copper oxide layer.

4. The method of claim 3 wherein the step of depositing the barrier layer comprises depositing a layer selected from the group consisting of silicon nitride, silicon carbide, SiCN, oxygen doped SiC, silicon-hydrogen-carbide, and carbon-doped silicon oxide.

5. The method of claim 4 wherein the step of depositing the barrier layer comprises depositing a silicon nitride layer at a temperature of about 400° C. or less.

6. A method of fabricating a semiconductor device, the method comprising:
    providing a wafer bearing a copper metallization layer;
    removing a portion of the copper metallization layer, wherein the removing of the copper generates a residual copper oxide layer on an unremoved portion of the copper metallization layer;
    treating the wafer with a plasma to remove the residual copper oxide layer, wherein the plasma is formed from a gas consisting essentially of ammonia and at least one of helium and hydrogen; and
    depositing a barrier layer on the treated, unremoved portion of the copper metallization layer.

7. The method of claim 6, wherein the removing of the portion of the copper metallization layer includes a chemical-mechanical-polishing step.

8. The method of claim 6, wherein the plasma is formed from a gas consisting of ammonia.

9. The method of claim 6, wherein the barrier layer comprises silicon nitride.

10. The method of claim 9, wherein the silicon nitride barrier layer is deposited at a temperature of about 400° C. or less.

11. The method of claim 6, wherein the barrier layer is selected from the group consisting of silicon nitride, silicon carbide, SiCN, oxygen doped SiC, silicon-hydrogen-carbide, and carbon-doped silicon oxide.

12. The method of claim 6, wherein the steps of treating the wafer with a plasma to remove the residual copper oxide layer and depositing a barrier layer are performed in the same processing chamber.

* * * * *

UNITED STATES PATENT AND TRADEMARK OFFICE
CERTIFICATE OF CORRECTION

PATENT NO. : 7,723,228 B2 Page 1 of 1
APPLICATION NO. : 10/442359
DATED : May 25, 2010
INVENTOR(S) : Rajagopalan et al.

It is certified that error appears in the above-identified patent and that said Letters Patent is hereby corrected as shown below:

Column 16, claim 3, line 14, delete "farther" and insert --further--

Signed and Sealed this

Thirteenth Day of July, 2010

David J. Kappos
*Director of the United States Patent and Trademark Office*